(12) United States Patent
Shibata et al.

(10) Patent No.: US 8,216,440 B2
(45) Date of Patent: Jul. 10, 2012

(54) METHOD FOR ALIGNING MICROSCOPIC STRUCTURES AND SUBSTRATE HAVING MICROSCOPIC STRUCTURES ALIGNED, AS WELL AS INTEGRATED CIRCUIT APPARATUS AND DISPLAY ELEMENT

(75) Inventors: Akihide Shibata, Santa Clara, CA (US); Yasunobu Okada, Gifu (JP)

(73) Assignees: Sharp Kabushiki Kaisha, Osaka (JP); Nanosys, Inc., Palo Alto, CA (US)

( * ) Notice: Subject to any disclaimer, the term of this patent is extended or adjusted under 35 U.S.C. 154(b) by 1127 days.

(21) Appl. No.: 12/081,018

(22) Filed: Apr. 9, 2008

(65) Prior Publication Data

US 2008/0251381 A1  Oct. 16, 2008

(30) Foreign Application Priority Data

Apr. 10, 2007 (JP) ................................. 2007-102848

(51) Int. Cl.
*C25D 1/12* (2006.01)
(52) U.S. Cl. ......... 204/547; 204/471; 204/164; 204/643
(58) Field of Classification Search .................. 204/155, 204/164, 232, 547, 471, 643
See application file for complete search history.

(56) References Cited

U.S. PATENT DOCUMENTS

| | | | | |
|---|---|---|---|---|
| 6,596,143 | B1 * | 7/2003 | Wang et al. | 204/547 |
| 7,161,107 | B2 * | 1/2007 | Krupke et al. | 209/127.1 |
| 7,744,737 | B1 * | 6/2010 | James et al. | 204/547 |
| 2008/0108172 | A1 * | 5/2008 | Xi et al. | 438/99 |

FOREIGN PATENT DOCUMENTS

| | | |
|---|---|---|
| JP | 2004-71654 A | 3/2004 |
| JP | 2005-197612 A | 7/2005 |
| WO | WO-2006/078281 A2 | 7/2006 |

OTHER PUBLICATIONS

Pohl, H.A., "Dielectrophoresis", Cambridge University Press, New York, pp. 1-8 (1978).
Whang, et al. "Nanolithography Using Hierarchically Assembled Nanowire Masks", Nano Letters, vol. 3, No. 7, pp. 951-954 (2003).
Hamers, et al. "Electrically Directed Assembly and Detection of Nanowire Bridges in Aqueous Media", Nanotechnology, vol. 17, pp. S280-S286, (2006).

* cited by examiner

*Primary Examiner* — Robert J Hill, Jr.
*Assistant Examiner* — Dwan A Gerido
(74) *Attorney, Agent, or Firm* — Birch, Stewart, Kolasch & Birch, LLP

(57) ABSTRACT

An object of the present invention is to implement a method for aligning microscopic structures in desired locations and in a desired direction, in order to align microscopic structures, such as nanostructures, with high precision. The method includes a substrate forming step of forming three electrodes to which independent potentials can be applied, a microscopic structure liquid applying step of applying a liquid in which microscopic structures are dispersed to the insulating substrate, and a microscopic structure aligning step of applying respective voltages to the three electrodes to align the microscopic structures in locations defined by the electrodes.

15 Claims, 28 Drawing Sheets

METHOD FOR ALIGNING MICROSCOPIC STRUCTURES AND SUBSTRATE HAVING MICROSCOPIC STRUCTURES ALIGNED, AS WELL AS INTEGRATED CIRCUIT APPARATUS AND DISPLAY ELEMENT

CROSS-REFERENCE TO RELATED APPLICATION

This application is related to Japanese Patent Application No. 2007-102848 filed on Apr. 10, 2007, whose priority is claimed under 35 USC §119, the disclosure of which is incorporated by reference in its entirety.

BACKGROUND OF THE INVENTION

1. Field of the Invention

The present invention relates to a method for aligning microscopic structures and a substrate having microscopic structures aligned, as well as an integrated circuit apparatus and a display element. In particular, the present invention relates to a method for aligning microscopic structures in desired locations and a substrate having microscopic structures aligned in desired locations, as well as an integrated circuit apparatus and a display having devices formed of microscopic structures aligned in desired locations in accordance with the method for aligning microscopic structures.

2. Description of the Related Art

In recent years, use of nanostructures, such as nanowires and nanotubes, as devices has been ardently examined. Patent Document 1: Japanese Unexamined Patent Publication No. 2005-197612, for example, discloses a quantum wire transistor where a plurality of silicon nanowires are bundled and a method for manufacturing the same. In addition, Non-Patent Document 1: Nano Letters, Vol. 3, No. 7 (2003) p. 951-954 discloses a method for assembling a great number of silicon quantum wires on a substrate having a large area. According to the method described in Non-Patent Document 1: Nano Letters, Vol. 3, No. 7 (2003) p. 951-954, silicon quantum wires fabricated in accordance with a Langmuir-Blodget method are separated and then delivered onto a substrate having a large area.

Furthermore, Patent Document 2: Japanese Unexamined Patent Publication No. 2004-71654 discloses an invention according to which a carbon nanotube solution in which carbon nanotubes are dispersed in a solvent is added dropwise to an area between a source electrode and a drain electrode while an alternating current voltage is applied between the electrodes, and thereafter, the solvent is removed. Thus, a direction in which carbon nanotubes are oriented can be controlled. Furthermore, Patent Document 2: Japanese Unexamined Patent Publication No. 2004-71654 discloses a technology in which carbon nanotubes are placed between the electrodes, and thereafter, a direct current voltage is applied so that carbon nanotubes having conductive characteristics are removed and only carbon nanotubes having semiconductor characteristics remain.

According to conventional methods, however, there isn't sufficiently accurate control in aligning nanostructures. A technology for aligning nanostructures with high precision is essential in order to form an integrated circuit, a display and the like using nanostructures as devices. Here, alignment with high precision means alignment of nanostructures in desired locations and in a desired direction.

SUMMARY OF THE INVENTION

An object of the present invention is to implement a method for aligning microscopic structures in desired locations and in a desired direction, in order to align microscopic structures, such as nanostructures, with high precision. Another object is to provide a substrate having microscopic structures aligning in desired locations and in a desired direction, and an integrated circuit apparatus and a display element having devices formed of microscopic structures aligned in desired locations and in a desired direction, as well as devices formed of microscopic structures which are aligned in desired locations and in a desired direction.

In order to achieve the objects, the method for aligning microscopic structures according to a first embodiment of the present invention includes: a substrate preparing step of defining one microscopic structure-aligning region having as an unit three electrodes to which independent potentials are applied and preparing an insulating substrate having one or more of the microscopic structure-aligning region formed; a microscopic structure applying step of applying a liquid including microscopic structures ranging from a nano scale to a micron scale on the insulating substrate; and a microscopic structure aligning step of applying respective voltages to the three electrode to align the microscopic structures in the microscopic structure-aligning regions defined by the electrodes.

The above-described configuration makes it possible to align microscopic structures in desired locations and in a desired direction with accurate control, and thus, makes so-called high-precision alignment possible. Accordingly, when microscopic structures aligned with high precision according to the present invention are used as devices, it becomes possible to make an integrated circuit, a display, and the like, high-performance, as well as to manufacture them with high yield.

Furthermore, the freedom in terms of a manner in which voltages can be applied significantly increases because there are three electrodes, and therefore, it becomes possible to improve alignment of silicon nanowires a great deal.

The method for aligning microscopic structures according to the first embodiment of the present invention makes it possible to align microscopic structures in desired locations and in a desired direction with accurate control and high precision. Accordingly, it becomes possible to make an integrated circuit, a display, and the like high-performance using microscopic structures as devices, as well as to manufacture them with high yield.

Furthermore, the freedom in terms of the manner in which voltages can be applied significantly increases because there are three electrodes, and therefore, it becomes possible to improve alignment of silicon nanowires a great deal.

DESCRIPTION OF THE PREFERRED EMBODIMENTS

Figure 1:
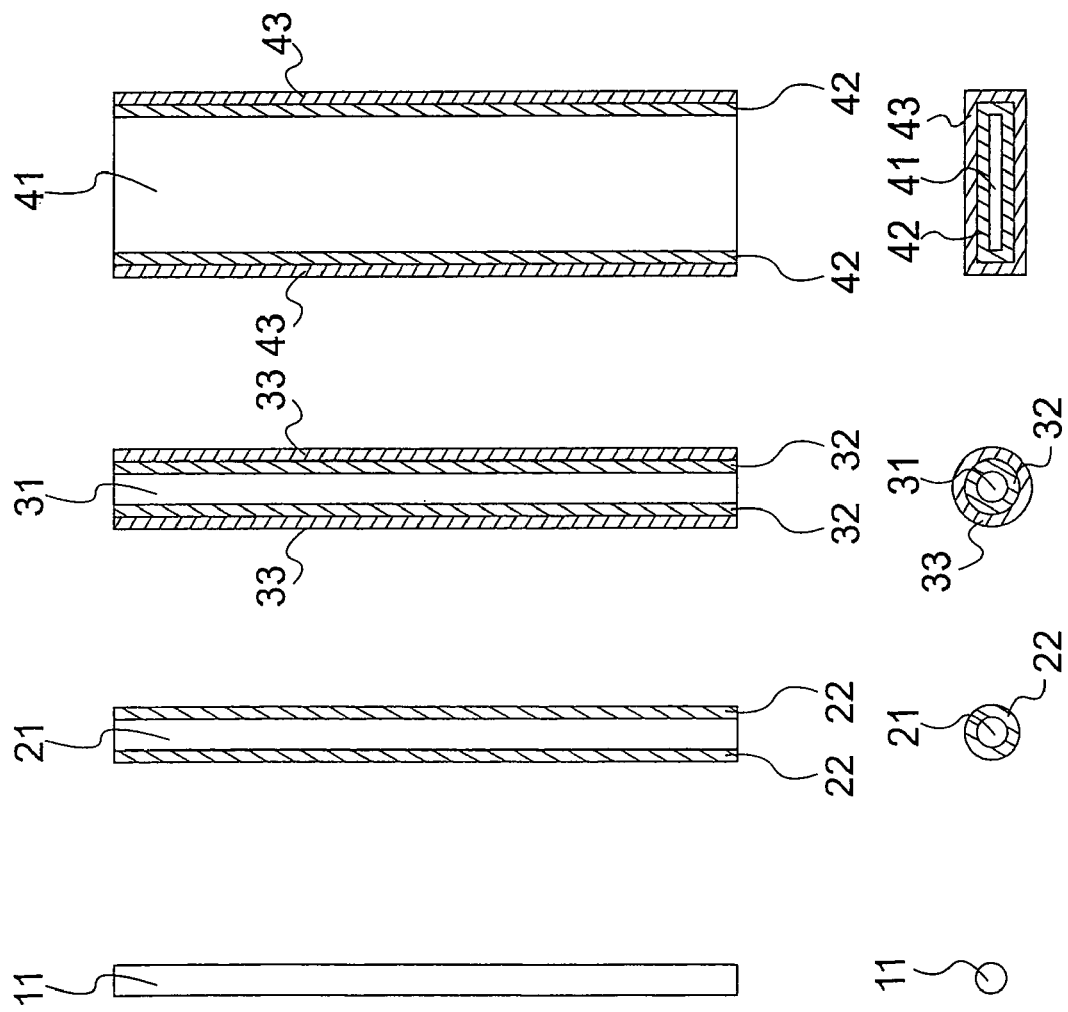
FIGS. 1A to 1D are each a diagram showing a microscopic structure used in a method for aligning microscopic structures according to the present invention.

According to the first embodiment of the present invention, a first electrode and a second electrode among the three electrodes define the microscopic structure-aligning region, and a third electrode is placed between the first and second electrodes in the microscopic structure-aligning region, and a reference potential is applied to the third electrode and alternating current potentials are applied to the first and second electrodes during the microscopic structure aligning step.

Therefore, the microscopic structures can be stably aligned with high precision, even in the case where the microscopic structures are not electrically neutral, and charged positively or negatively as a whole.

In addition, according to the first embodiment of the present invention, the alternating current potentials applied to the first and second electrodes have the same frequency and a phase difference of 150 to 210°.

Therefore, the relative voltage applied to the first and second electrodes can be made significantly high relative to the voltage (amplitude) applied to the first and second electrodes, and therefore, it becomes possible to greatly reduce a large number of microscopic structures adsorbed in unpreferred locations while an electrical field having an intensity required for alignment of the microscopic structures can be secured.

In addition, according to the first embodiment of the present invention, an microscopic structure-aligning region is defined by the first and second electrodes among the three electrodes so that the third electrode extends between the first and second electrodes, and an offset voltage applying operation for applying an offset voltage for the third electrode to the first and second electrodes is carried out during the microscopic structure aligning step.

Therefore, it is possible to remove only the microscopic structures which are adsorbed in the unpreferred locations while the microscopic structures aligned between the electrodes are left as they are. Accordingly, it is possible to align microscopic structures with high precision only in desired locations uniformly in a large area.

In addition, according to the first embodiment of the present invention, a time difference in applying the offset voltage to the first and second electrodes is 0.1 second or less in the offset voltage applying operation.

Therefore, it is possible to remove only the microscopic structures which are adsorbed in unpreferred locations without disturbing the alignment of the microscopic structures aligned between the electrodes.

In addition, according to the first embodiment of the present invention, the offset voltages applied to the first and second electrodes are equal in the offset voltage applying operation.

Therefore, it is possible to remove only the microscopic structures which are adsorbed in unpreferred locations without disturbing the alignment of the microscopic structures aligned between the electrodes.

In addition, according to the first embodiment of the present invention, the offset voltage applying operation is repeated.

Therefore, it is possible to remove only the microscopic structures which are adsorbed in unpreferred locations while the microscopic structures aligned between the electrodes are left as they are.

Furthermore, in order to repeat the offset voltage applying operation, silicon nanowires are not adsorbed in unpreferred locations and float to the area between the electrodes, where they can be aligned. Therefore, the time required for the alignment can be greatly shortened.

In addition, according to the first embodiment of the present invention, the offset voltage applying operation is carried out at intervals of 1 to 10 seconds.

Therefore, the microscopic structures adsorbed in unpreferred locations can be sufficiently moved away from the electrodes, and at the same time prevented from being adsorbed again by the electrodes. Accordingly, maximal effects of greatly shortening the time required for alignment of microstructures can be provided.

In addition, according to the first embodiment of the present invention, an average of the potentials applied to the first and second electrodes is different from the reference potential applied to the third electrode.

Therefore, it becomes possible to control the density of alignment of the microscopic structures.

In addition, according to the first embodiment of the present invention, the microscopic structures are characterized by being aligned mainly in a direction perpendicular to a direction in which the above descried electrodes are formed.

Therefore, the microscopic structures are aligned in the same direction, and therefore, the microscopic structures can be aligned with high precision.

In addition, according to the first embodiment of the present invention, the above-described microscopic structures are aligned in locations separated by a distance beyond a repulsive force generated by a charge induced in the microscopic structures.

Therefore, the microscopic structures are placed at equal intervals and can be aligned with high precision.

In addition, according to the first embodiment of the present invention, an integrated circuit apparatus having devices formed of the microscopic structures which are aligned in accordance with the method for aligning microscopic structures is provided.

Therefore, the integrated circuit apparatus can be made high performance, and the yield can be greatly increased.

In addition, according to the first embodiment of the present invention, a display having the devices formed of microscopic structures which are aligned in accordance with the method for aligning microscopic structures is provided.

Therefore, the display can be made high performance, and the yield can be greatly increased.

The method for aligning microscopic structures according to a second embodiment of the present invention includes: a substrate preparing step of defining one microscopic structure-aligning region having as an unit three electrodes including fourth, fifth and sixth electrodes to which independent potentials are applied and preparing an insulating substrate having one or more of the microscopic structure-aligning region formed; a microscopic structure applying step of applying a liquid including microscopic structures ranging from a nano scale to a micron scale on the insulating substrate; a microscopic structure aligning step of applying voltages to the three electrodes to align the microscopic structures in the microscopic structure-aligning region defined by the electrodes, wherein the microscopic structure aligning step includes a first microscopic structure aligning step of aligning first microscopic structures across the fourth and fifth electrodes, and a second microscopic structure aligning step of aligning the second microscopic structures across the fifth and sixth electrodes, in the first microscopic structure aligning step, a reference potential is applied to the fifth and sixth electrodes and a potential that is different from the reference potential is applied to the fourth electrode, and in the second microscopic structure aligning step, a reference potential is applied to the fourth and fifth electrodes and a potential that is different from the reference potential is applied to the sixth electrode.

The above-described configuration makes it possible to align microscopic structures in desired locations and in a desired direction with accurate control, and thus, alignment with high precision becomes possible. Accordingly, it becomes possible to make the integrated circuit, the display and the like high performance, as well as to manufacture them with high yield, using these microscopic structures as devices.

Furthermore, it becomes possible to selectively align two types of microscopic structures in respective desired locations.

The second embodiment of the present invention is characterized in that an offset voltage for the fourth and fifth electrodes is applied to the sixth electrode during the first microscopic structure aligning step.

According to the above-described embodiment, microscopic structures which are adsorbed in unpreferred locations can be prevented from being mixed in when two types of microscopic structures are selectively aligned in respective desired locations.

In addition, the method for aligning microscopic structures according to the present invention is characterized in that in the first and second embodiments, the microscopic structures are aligned mainly in the direction perpendicular to the direction in which the above-described electrodes are formed.

According to the above-described embodiments, the microscopic structures are aligned in the same direction, and therefore, the microscopic structures can be aligned with high precision.

In addition, the method for aligning microscopic structures according to the present invention is characterized in that in the first and second embodiments, the microscopic structures are aligned in locations separated by a distance beyond a repulsive force generated by a charge induced in the microscopic structures.

According to the above-described embodiment, the microscopic structures are aligned at approximately equal intervals, and can be aligned with high precision.

The integrated circuit apparatus according to a third embodiment of the present invention is provided with devices formed of the microscopic structures which are aligned in accordance with the method for aligning microscopic structures according to the first and second embodiments.

In the above-described configuration, the devices are formed in accordance with the method for aligning microscopic structures in desired locations in a desired direction with accurate control, and therefore, it becomes possible to make the integrated circuit apparatus high-performance and increase the yield a great deal.

The display according to a fourth embodiment of the present invention is provided with devices formed of the microscopic structures which are aligned in accordance with the method for aligning microscopic structures in the first and second embodiments.

In the above-described configuration, the devices are formed in accordance with the method for aligning microscopic structures in desired locations in a desired direction with accurate control, and therefore, it becomes possible to make the display high-performance and increase the yield a great deal.

In addition, according to another embodiment of the present invention, a substrate having microscopic structures aligned is provided with: a substrate; three electrodes formed on the substrate; microscopic structures placed at equal intervals among the three electrodes in such a manner as to bridge the electrodes mainly in the direction perpendicular to the direction in which the electrodes are formed.

According to the above-described embodiment, the substrate having the microscopic structures aligned with high precision can be gained.

In addition, the substrate having the microscopic structures aligned according to the present invention is characterize in that the microscopic structures are aligned in locations separated by a distance beyond a repulsive force generated by a charge induced in the microscopic structures.

According to the above-described embodiment, the substrate having the microscopic structures aligned with higher precision can be gained.

Hereinafter, the present invention is described in detail.

According to the present invention, microscopic structures include nanowires, nanotubes and quantum wires, for example. The material is a metal, a semiconductor, a dielectric body or a multilayer body thereof. As the semiconductor material, silicon, GaAs, GaN, SiC, carbon nanotubes and the like can be used. As the metal material, gold, silver, copper, iron, tungsten, tungsten nitride, aluminum, tantalum and alloys thereof can be used. In addition, as the dielectric body, silicon oxide films, silicon nitride films, silicon oxide nitride films, aluminum oxide, titanium oxide, hafnium oxide and the like can be used. Nanowires, nanotubes, quantum wires made of these materials or multilayer bodies thereof can be manufactured in accordance with a VLS (vapor-liquid-solid) method, for example, for nanowires, an HiPCO (high pressure carbon monoxide) method for nanotubes, and other methods.

In accordance with the VLS method, when nanowires grow as a result of deposition of silicon beneath gold particles, the nanowires grow so as to keep a crystallinity of a silicon crystal directly beneath. That is to say, the nanowires have a direction in which they easily grow, and therefore, when a silicon substrate of which the direction of crystal is perpendicular to the surface of the substrate is used, nanowires grow perpendicularly to the surface of the substrate so as to keep the crystallinity of the silicon substrate. According to this method, nanowires of a constant length in the form of a straight line can be manufactured. In addition, it is possible to manufacture nanowires of a constant length in the form of a straight line while maintaining a certain relationship between the length and the diameter of the nanowires and controlling the form of the nanowires, nanotubes or quantum wires.

It is not necessary for all of the dimensions of the nanowires, nanotubes and quantum wires used in the present invention to be on a nanoscale. For example, nanowires or microwires having a diameter of several tens of nm to several μm and a length of several μm to several hundreds of μm may be included in the microscopic structures of the present invention. In the case of microscopic structures in a rod form, the thickness is less than about 1 μm and the length is several tens of μm. Accordingly, the present invention can be applied to microscopic structures on a so-called nanoscale to a micron scale.

FIGS. 1A to 1D show examples of a microscopic structure. FIGS. 1A to 1D show each a cross sectional diagram along a plane including a center line of a microscopic structure in a length direction, and a cross sectional diagram along a plane in a direction perpendicular to the length direction. In FIG. 1A, a microscopic structure is a single layer nanowire or a single layer nanotube 11. In FIG. 1B, a microscopic structure has a two-layer structure where a nanowire or nanotube 21 is coated with an insulating body 22. In FIG. 1C, a microscopic structure has a three-layer structure where a nanowire or nanotube 31 is coated with an insulating body 32, which is further coated with a metal film 33. It is not necessary for the microscopic structures to be of a columnar form, and the microscopic structures may be in a plate form, as shown in FIG. 1D. In FIG. 1D, reference numerals 41 indicate a conductor in a plate form, reference numerals 42 indicate an insulating body and reference numerals 43 indicate a metal film. Furthermore, the nanowire, or nanotube, may be polygonal (for example, triangular or hexagonal).

It is desirable for the microscopic structure according to the present invention to be in the form of a straight line and have a constant length. An appropriate material, conductivity type (in the case where the microscopic structure includes a semiconductor) and structure can be selected for the microscopic structures, and thus, switching elements, light emitting elements, resistor elements and the like can be formed.

Hereinafter, a case where a microscopic structure having the structure in FIG. 1C are aligned is described in the embodiments for the alignment of microscopic structures. Concretely, a case where microscopic structures where a nanowire 31 made of silicon is coated with an insulating film 32 made of a silicon oxide film and further coated with a metal film 33 made of TaAlN are aligned is described. However, the microscopic structure may be a microscopic structure having the structure shown in FIGS. 1A to 1D. It is desirable for these silicon nanowires to be in the form of a straight line and have a constant length. Hereinafter, these microscopic structures are referred to as a silicon nanowire.

As for a size of the silicon nanowire, the thickness is about 150 nm and the length is about 25 μm. In more detail, the radius of the nanowire 31 made of silicon is about 45 nm, the film thickness of the insulating film 32 made of a silicon oxide film is about 15 nm, and the film thickness of the metal film 33 made of TaAlN is about 15 nm. These numeral values are examples, and the present invention is not limited to these.

In addition, in the embodiments where a microscopic structure is applied to a device, a microscopic structure having the structure shown in FIG. 1B is used. However, the microscopic structure may be that shown in FIGS. 1A to 1D. More concretely, a case where a microscopic structure where a nanowire 21 made of silicon is coated with an insulating film 22 made of a silicon oxide film is applied to a device is described. It is desirable for this silicon nanowire to be in the form of a straight line and have a constant length.

As for the size of the silicon nanowire applied to the device, the thickness is about 120 nm and the length is about 25 nm. In more detail, the radius of the nanowire 21 made of silicon is about 45 nm and the film thickness of the insulating film 22 made of a silicon oxide film is about 15 nm. These numeric values are examples, and the present invention is not limited to these.

(Basic Configuration of the Present Invention)

Figure 2:
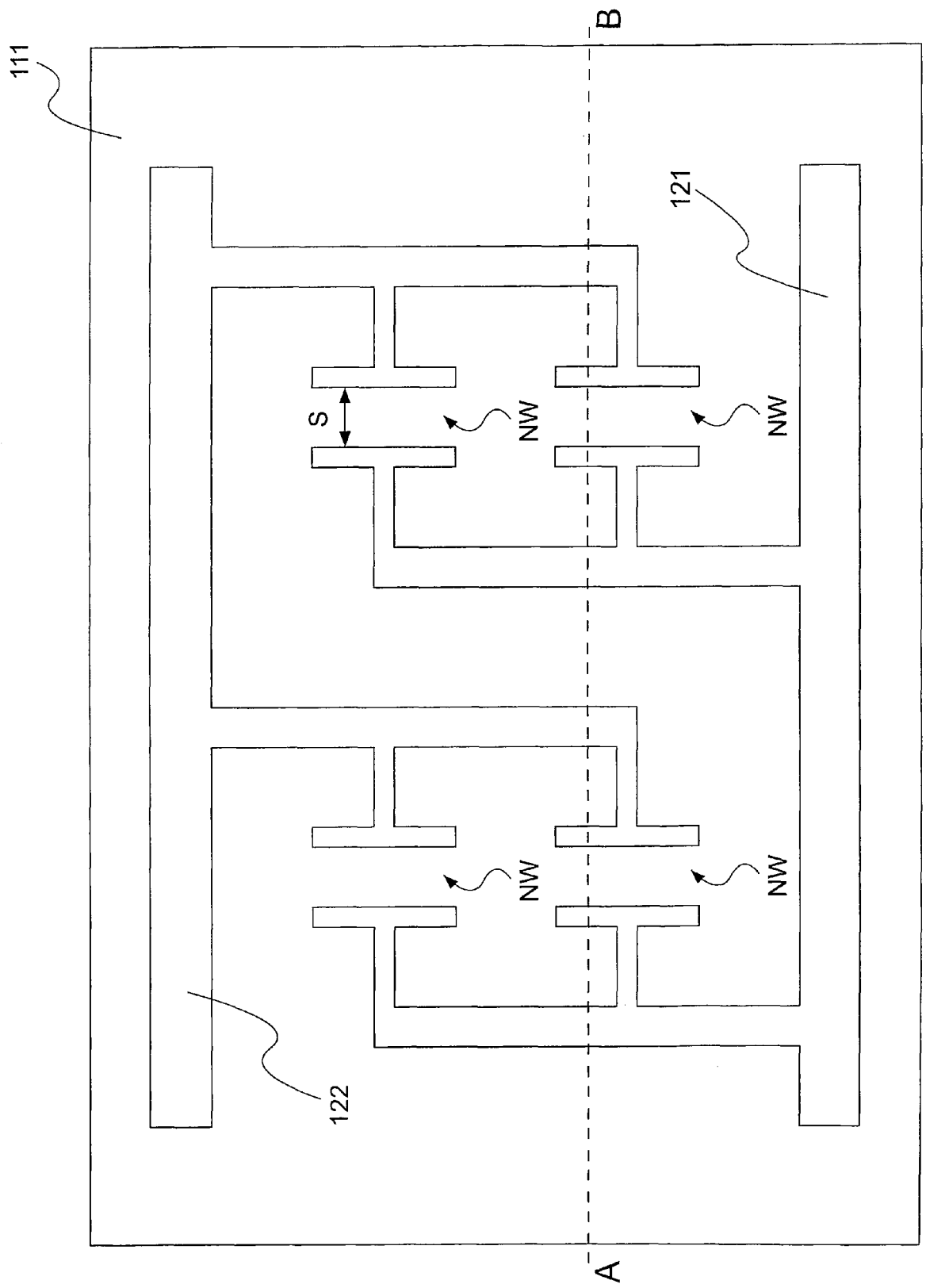
FIG. 2 is a diagram illustrating an insulating substrate used in a basic configuration according to the present invention.
Figure 3:
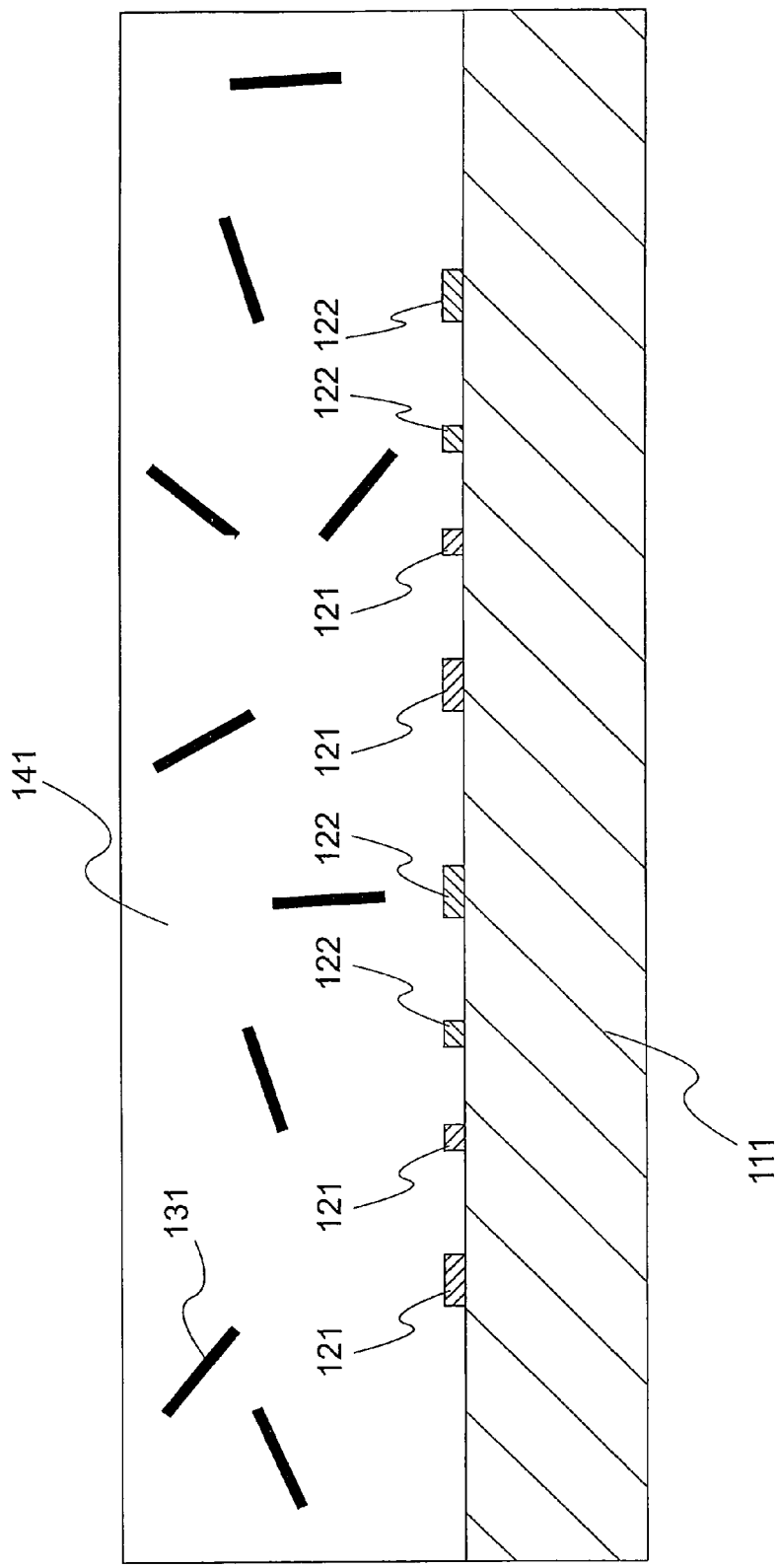
FIG. 3 is a diagram illustrating a procedure for aligning microscopic structures on an insulating substrate in the basic configuration according to the present invention.
Figure 4:
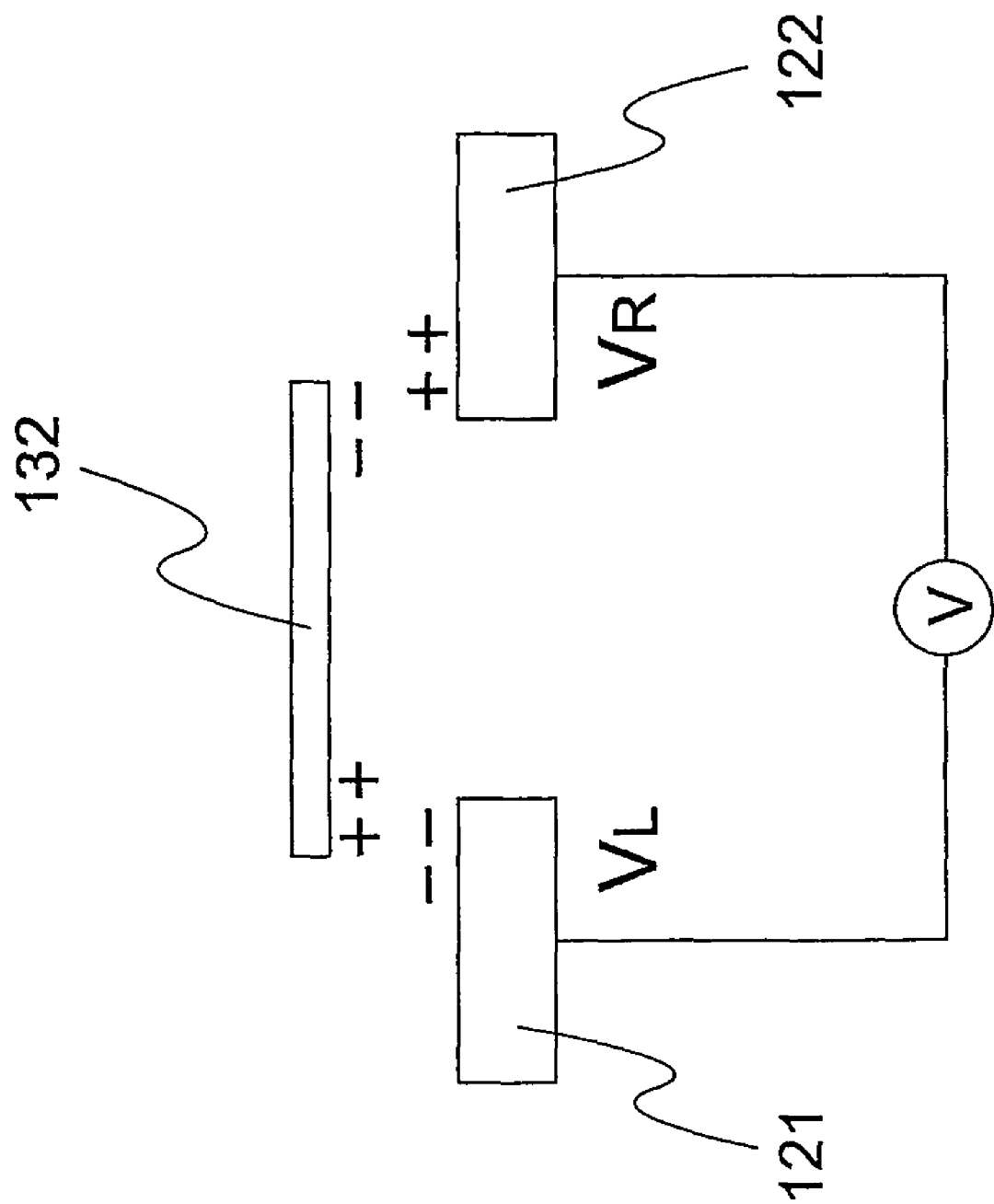
FIG. 4 is a diagram illustrating a principle behind how microscopic structures are aligned in the basic configuration according to the present invention.
Figure 5:
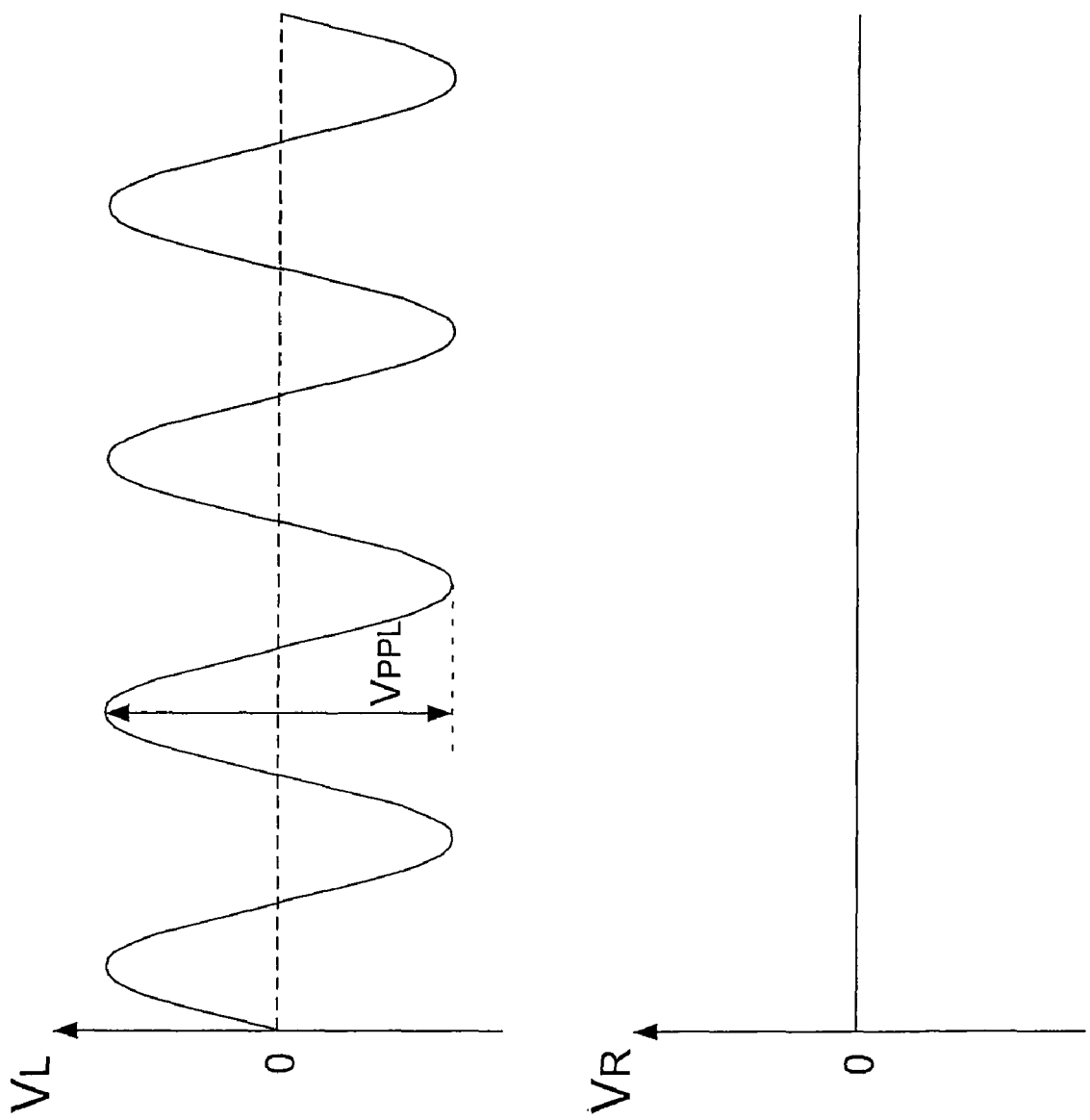
FIG. 5 is a diagram illustrating preferable potentials to be applied to electrodes when microscopic structures are aligned in the basic configuration according to the present invention.
Figure 8:
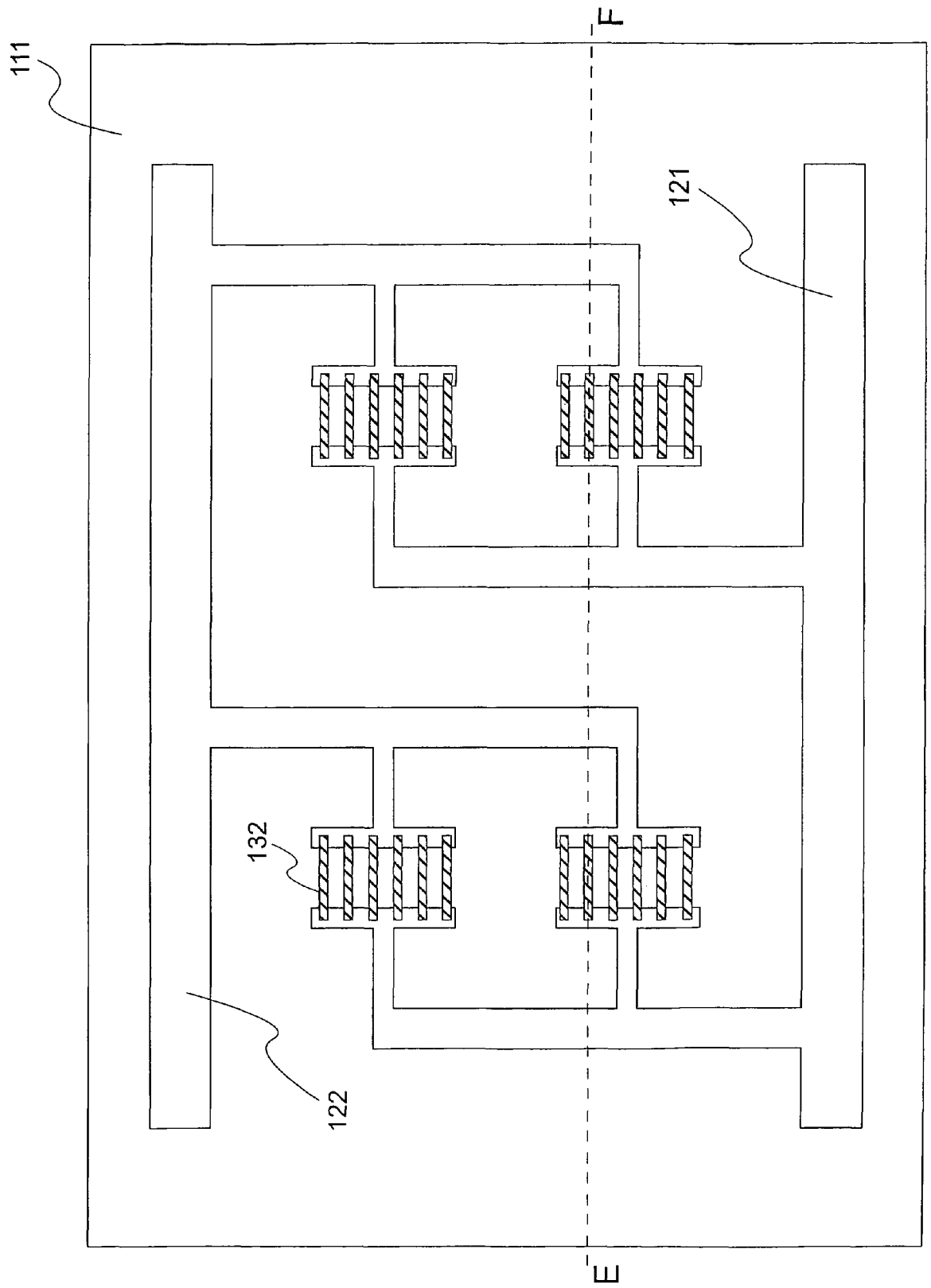
FIG. 8 is a diagram illustrating the procedure for aligning microscopic structures on an insulating substrate in the basic configuration according to the present invention.
Figure 9:
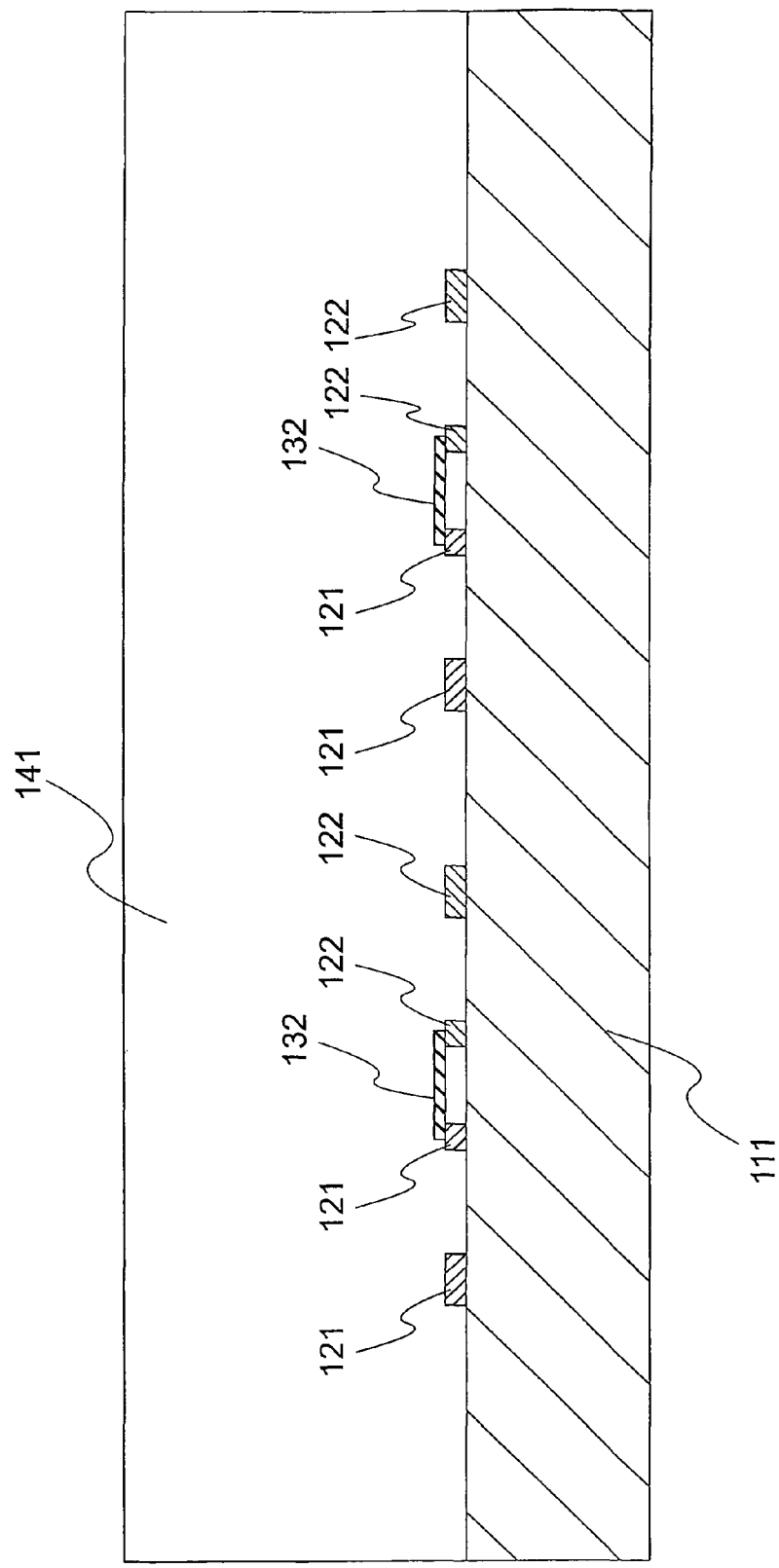
FIG. 9 is a diagram illustrating the procedure for aligning microscopic structures on an insulating substrate in the basic configuration according to the present invention and a cross sectional diagram along a line E-F in FIG. 8.
Figure 10:
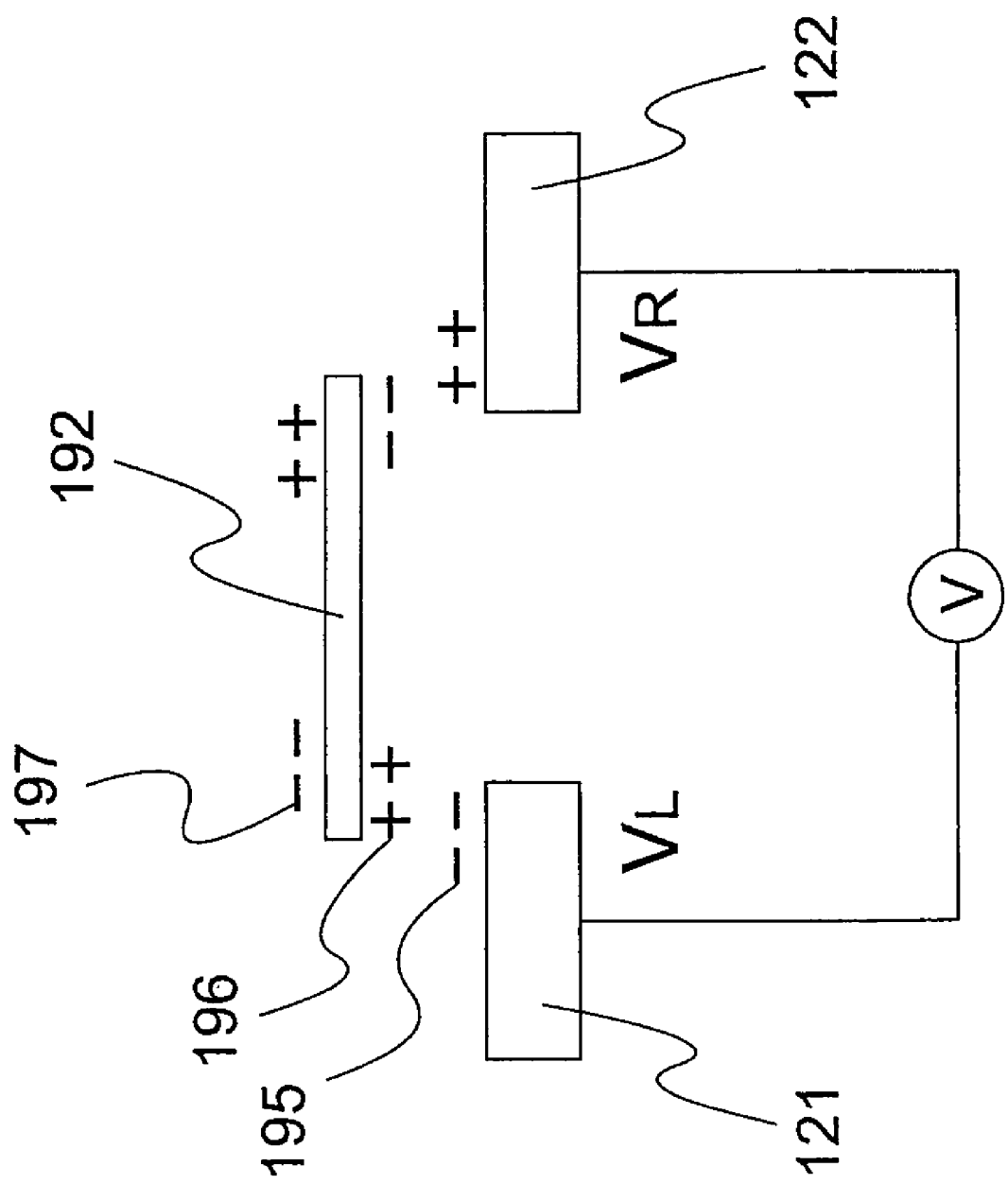
FIG. 10 is a diagram illustrating the principle behind how microscopic structures are aligned in the basic configuration according to the present invention.

The basic configuration of the present invention is described in reference to FIGS. 2 to 10. FIG. 2 shows an insulating substrate used in the basic configuration of the present invention, FIGS. 3 and 6 to 9 are diagrams illustrating the procedure of the method for aligning microscopic structures used in the basic configuration of the present invention, FIGS. 4 and 10 are diagrams illustrating the principle of alignment of microscopic structures, and FIG. 5 is a diagram illustrating preferable potentials to be applied to the electrodes when microscopic structures are aligned.

In the basic configuration of the present invention, the method for aligning microscopic structures includes the microscopic structure liquid applying step of applying a liquid in which microscopic structures are dispersed on an insulating substrate where two electrodes to which independent potentials can be applied are formed, and the microscopic structure aligning step of aligning the above-described microscopic structures in locations defined by the above-described two electrodes by applying voltages in different patterns to the above-described two electrodes. Hereinafter, this is described in detail in reference to the drawings.

FIG. 2 shows an insulating substrate having silicon nanowires aligned. An insulating substrate 111 is such as glass, ceramic, alumina, resin or a substrate having a silicon oxide film formed on the surface of a semiconductor, such as silicon, and which thus has a surface with insulating properties. In the case where a glass substrate is used, it is desirable to form a base insulating film, such as a silicon oxide film or a silicon nitride film, on the surface.

Metal electrodes 121 and 122 are formed on the surface of the insulating substrate 111. The metal electrodes 121 and 122 can be formed in a desired electrode form using a printing technology. Alternatively, the metal electrodes can be formed by uniformly layering a metal film and a photosensitive film, exposing a desired electrode pattern to light, and then carrying out etching.

Though not shown in FIG. 2, pads are formed on the metal electrodes 121 and 122 so that potentials can be applied from the outside. Silicon nanowires are aligned in portions where the metal electrodes 121 and 122 face each other (regions indicated by NW in FIG. 2). In FIG. 2, 2×2 regions in which silicon nanowires are aligned are aligned. However, any number of regions can, of course, be aligned.

Here, it is preferable for a distance S between the metal electrodes 121 and 122 in the microscopic structure-aligning regions NW to be slightly less than the length of the silicon nanowires in the form of a straight line. In the basic configuration of the present invention, when the length of the silicon nanowires is about 25 μm, the silicon nanowires can be most efficiently aligned in the case where the distance S is 16 to 22 μm. That is, the distance S may be about 60 to 90% of the silicon nanowires, and is desirably 80 to 90%. FIGS. 2 to 10 do not correctly show the relationship in the dimensions between the electrodes and the silicon nanowires, for the sake of ease of viewing.

Next, the procedure for aligning silicon nanowires on the insulating substrate 111 is described. First, as shown in FIG. 3 (cross sectional diagram along a line A-B in FIG. 2), isopropyl alcohol (IPA) 141 in which silicon nanowires 131 are dispersed is thinly applied on the insulating substrate 111. Instead of IPA 141, ethylene glycol, propylene glycol, methanol, ethanol, acetone or a mixture thereof may be used. Alternatively, instead of IPA 141, a liquid made of another organic substance, water, or the like, may be used. Accordingly, IPA 141 may indicate a liquid in which the silicon nanowires 131 are dispersed.

Here, when a large current flows across the metal electrodes 121 and 122 through the liquid, a desired difference in voltage cannot be applied across the metal electrodes 121 and 122. In such a case, the entirety of the surface of the insulating substrate 111 may be coated with an insulating film of about 10 to 30 nm so that the metal electrodes 121 and 122 are covered.

The thickness of the applied IPA 141 including silicon nanowires is such that the silicon nanowires can move in the liquid, so that the silicon nanowires can be aligned in the following step of aligning silicon nanowires. Accordingly, the thickness is greater than the thickness of the silicon nanowires and, for example, several μm to several mm. In the case where the applied thickness is too thin, it becomes difficult for the silicon nanowires to move, while in the case where it is too thick, the time for drying the liquid becomes long. Preferably, the thickness is 100 to 500 μm.

In addition, it is preferable for the amount of the silicon nanowires to be $1\times10^4$ to $1\times10^7/cm^3$ relative to the amount of IPA.

In order to apply the IPA 141 including silicon nanowires, frames are formed in the outer periphery of the metal electrodes for which silicon wires are aligned, and the inside of the frames may be filled with the IPA 141 including silicon nanowires with a desired thickness. In the case where the IPA 141 including silicon nanowires has a high viscosity, however, it is possible to apply the IPA 141 with a desired thickness without requiring frames.

It is desirable for the viscosity of the liquid, for example IPA, ethylene glycol, propylene glycol or a mixture thereof, or a liquid made of another organic substance or water, to be low for the step of aligning silicon nanowires, and for the liquid to easily evaporate when heat is applied.

Next, a difference in potential is created between the metal electrodes 121 and 122. In the basic configuration of the present invention, a difference in potential of 1 V is appropriate. 0.1 to 10 V can be applied for the difference in potential between the metal electrodes 121 and 122. In the case of 0.1 V or lower, however, alignment of silicon nanowires becomes poor, while in the case of 10 V or higher, the insulation between the metal electrodes becomes a problem. Accordingly, the difference in potential is preferably 1 to 5 V, and more preferably about 1 V.

FIG. 4 shows the principle of alignment of silicon nanowires 132 on the metal electrodes 121 and 122. A potential $V_L$ is applied to the metal electrode 121 and a potential $V_R$ is applied to the metal electrode 122 ($V_L<V_R$). Then, a negative charge are induced in the metal electrodes 121 and a positive charge are induced in the metal electrodes 122, respectively. When a silicon nanowire 132 in the form of a straight line approaches the electrodes, a positive charge and a negative charge are induced on the side of the silicon nanowire closer to the metal electrode 121 and on the side closer to the metal electrode 122, respectively. A charge is induced in the silicon nanowire through electrostatic induction. That is, when a conductor is placed in an electrical field, a charge is induced on the surface of the conductor until the electrical field inside the conductor is 0. As a result, a force of attraction works between each electrode and each silicon nanowire, due to the electrostatic force. The silicon nanowire follows a line of electric force that is created between the metal electrodes 121 and 122. At the time of this alignment, the charge induced in each silicon nanowire is approximately equal, and therefore, silicon nanowires are aligned regularly at approximately equal intervals, due to the force of repulsion resulting from the charge. When the silicon nanowires are aligned at equal intervals in this manner, they are formed in one layer.

Though in the basic configuration of the present invention, the outermost layer of the silicon nanowire is coated with a metal film, it is possible to align the silicon nanowires on the electrodes in accordance with approximately the same principle in the case where the microscopic structures made of a dielectric body are used. In the case of microscopic structures made of a dielectric body, as shown in FIG. 10, a charge is induced on the surface when the dielectric body is polarized through an external electrical field generated between the metal electrodes 121 and 122, between which a difference in potential is created. A charge is induced in a nanowire 192 made of a dielectric body, as shown in FIG. 10. A positive charge 196 and a negative charge 197 are induced on the side closer to the metal electrode 121 and on the side farther from the metal electrode 121, respectively, in the vicinity of the metal electrode 121 (having a negative potential), for example. The negative charge 195 induced in the metal electrode 121 and the positive charge 196 induced in the nanowire 192 attract each other, while the negative charge 195 induced in the metal electrode 121 and the negative charge 197 induced in the nanowire 192 repel each other. However, the electrical field formed between the metal electrodes 121 and 122 becomes more intense closer to the metal electrodes.

Therefore, the force which works on the positive charge 196 induced in the nanowire (force of attraction) is greater than the force which works on the negative charge 197 (force of repulsion). Accordingly, the force of attraction works between the metal electrode 121 and the nanowire 192 as a whole. The force which works between the metal electrode 122 and the nanowire 192 is the same.

For the above-described reasons, even in the case where microscopic structure made of a dielectric body is used, the microscopic structures can be aligned on the electrodes. Here, the principle of a dielectric body placed in an electrical field having a steep gradient being attracted to an electrode is described in, for example, "Dielectrophoresis, H. A. Pohl, Cambridge University Press, New York, 1978." Accordingly, the material for the microscopic structures may be any of metals, semiconductors, dielectric bodies and multilayer bodies thereof.

As described above, according to the present invention, a charge is generated in microscopic structures through an external electrical field generated between the metal electrodes, so that the microscopic structures are adsorbed on the metal electrodes due to the force of attraction resulting from the charge, and therefore, it is necessary for the size of the microscopic structures to make it possible for the microscopic structures to move in the liquid. Accordingly, the size of the microscopic structures varies depending on the amount (thickness) of liquid applied. In the case where the amount of liquid applied is small, the microscopic structures are on a nanoscale, but in the case where the mount of liquid applied is great, the microscopic structures may be on a micron scale.

In the case where the microscopic structures are not electrically neutral but charged positively or negatively as a whole, the microscopic structures cannot be stably aligned simply by creating a difference in the static potential (DC) between the metal electrodes 121 and 122. In the case where a silicon nanowire 132 is charged positively as a whole, for example, the force of attraction toward the electrode 112 where a positive charge is induced becomes relatively weak. Therefore, the alignment of the silicon nanowires 132 becomes asymmetrical.

In this case, as shown in FIG. 5, it is preferable to apply an AC across the metal electrodes 121 and 122. In FIG. 5, a reference potential is applied to the electrode 121 and an AC voltage with an amplitude of $V_{PPL}/2$ is applied to the electrode 122. Thus, the alignment can be kept symmetrical, even in the case where the silicon nanowires 132 are charged as a whole.

Here, in the basic configuration of the present invention, it is preferable for the frequency of the alternating current voltage applied to the electrode 122 to be 10 Hz to 1 MHz. When the frequency of the alternating current voltage applied to the electrode 122 is less than 10 Hz, the silicon nanowires 132 serially vibrate, and the alignment is often disturbed. Meanwhile, when the frequency of the alternating current voltage applied to the electrode 122 is 1 MHz or higher, the force through which the silicon nanowires are adsorbed to the electrode becomes weak, and the alignment is sometimes disturbed by external disturbance. The alignment is most stable when the frequency is 50 Hz to 1 kHz, which is more preferable.

Furthermore, the AC voltage is not limited to being in sine waves, and may fluctuate periodically, for example as rectangular waves, triangular waves or serrated waves. Here, it is preferable for $V_{PPL}$ to be about 1 V.

Figure 6:
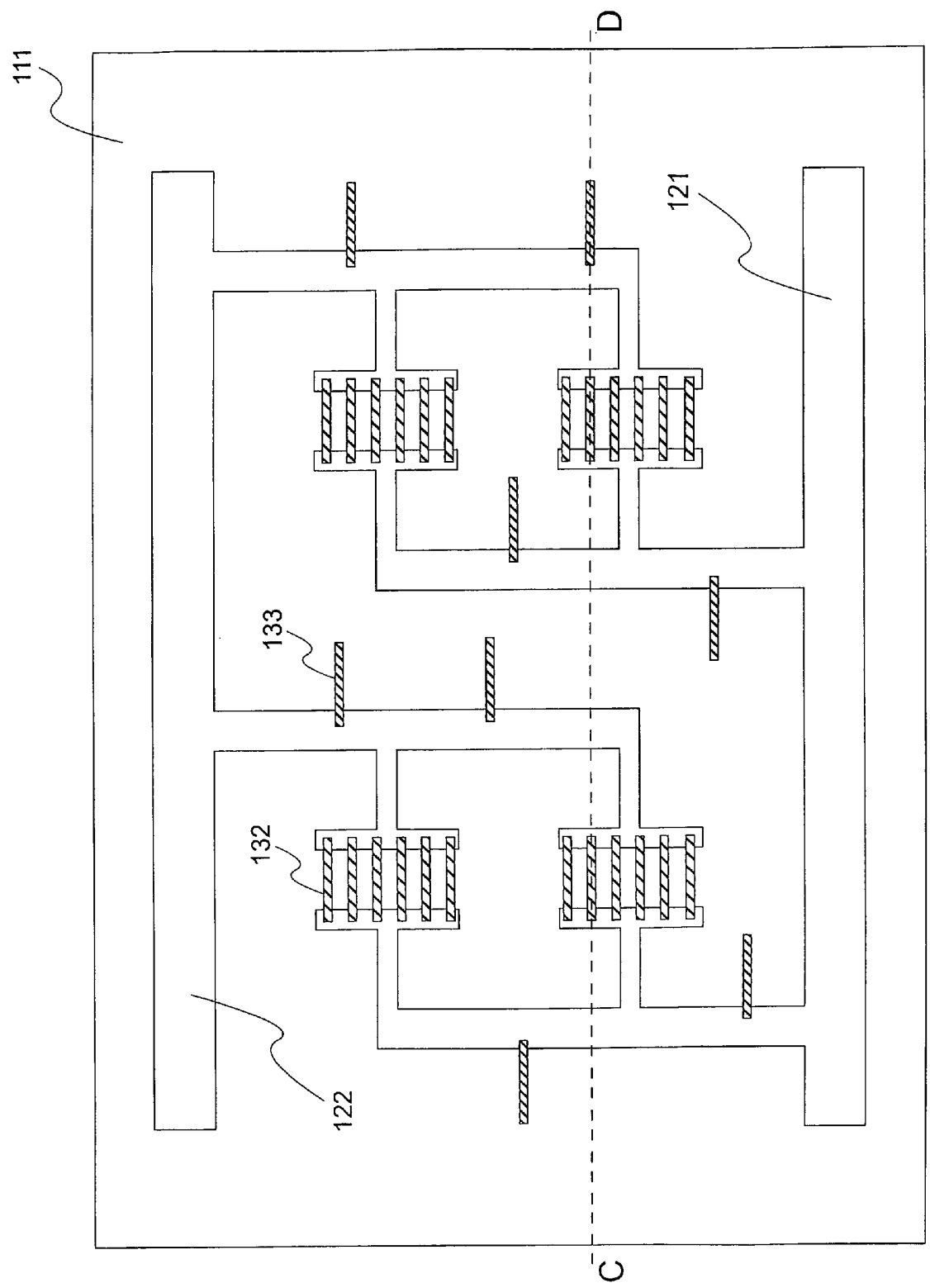
FIG. 6 is a diagram illustrating the procedure for aligning microscopic structures on an insulating substrate in the basic configuration according to the present invention.
Figure 7:
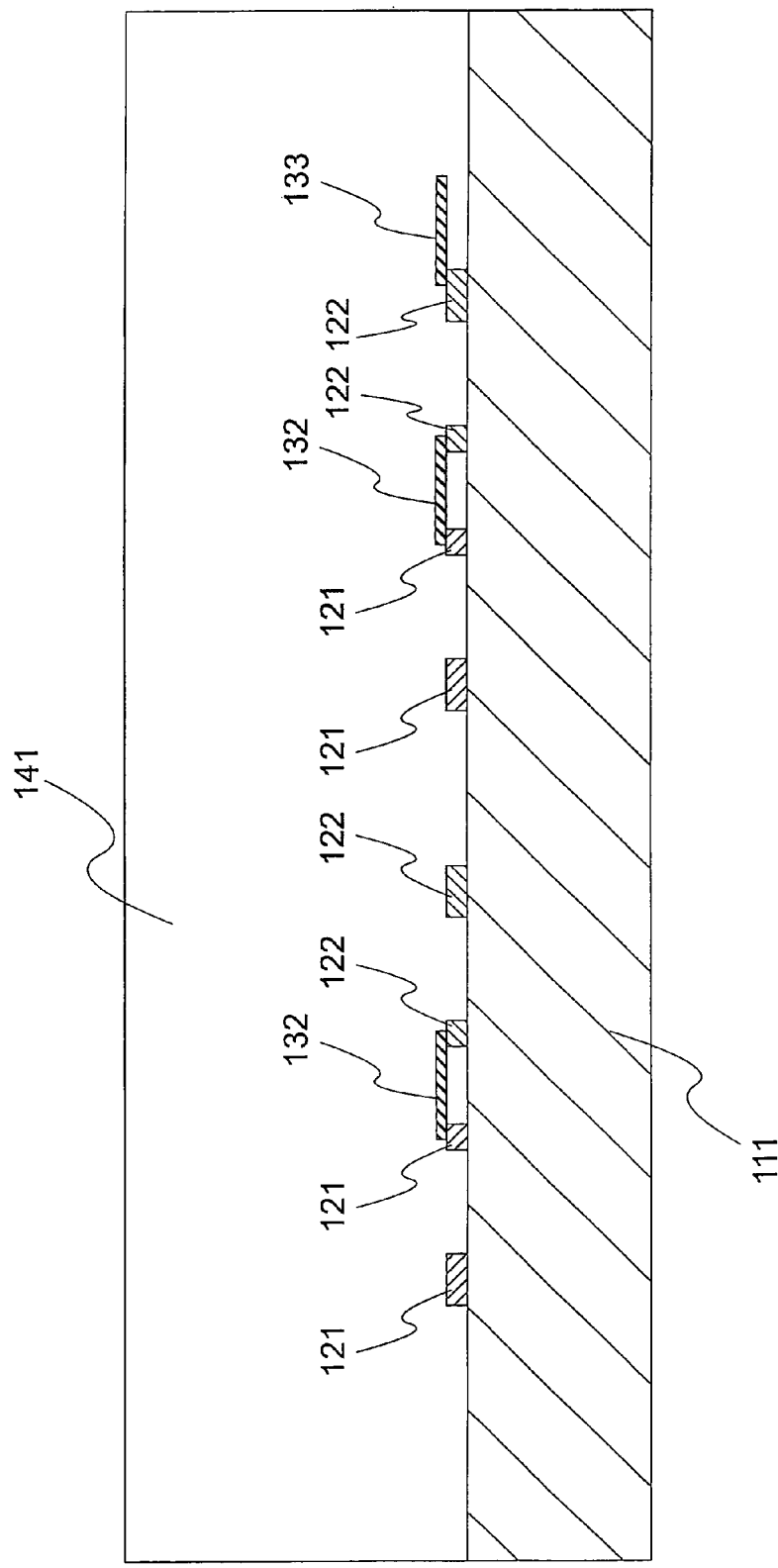
FIG. 7 is a diagram illustrating the procedure for aligning microscopic structures on an insulating substrate in the basic configuration according to the present invention and a cross sectional diagram along a line C-D in FIG. 6.

After a while after silicon nanowires start being aligned, as schematically shown in FIGS. 6 and 7, silicon nanowires are aligned. Silicon nanowires are hatched in the drawings. FIG. 7 is a cross sectional diagram along a line C-D in FIG. 6. The silicon nanowires 132 are aligned at approximately equal intervals in the direction perpendicular to the metal electrodes in the microscopic structure-aligning regions (portions where metal electrodes 121 and 122 face each other). The alignment of the silicon nanowires at approximately equal intervals means that the force of repulsion is working between the silicon nanowires, due to the charge induced in the silicon nanowires.

The silicon nanowires are adsorbed in portions other than the microscopic structure-aligning region. These are shown as silicon nanowires 133 in FIG. 6. In this manner, the presence of the silicon nanowires 133 which are adsorbed in undesired locations makes it necessary to add extra silicon nanowires, and in addition, causes reduction in the yield when the silicon nanowires are used as devices.

Therefore, the silicon nanowires 133 that are adsorbed in the undesired locations are removed by slowly flowing IPA while AC is being applied across the metal electrodes 121 and 122. In this case, it is preferable for the IPA or an application liquid not to include silicon nanowires. The force of adsorption to an electrode of the silicon nanowires 133 adsorbed in the undesired locations is weak in comparison with that of the silicon nanowires 132, which are adsorbed in the desired locations. Therefore, as schematically shown in FIGS. 8 and 9, the silicon nanowires 133 which are adsorbed in the unpreferred locations can be removed. FIG. 9 is a cross sectional diagram along a line E-F in FIG. 8.

As described above, the silicon nanowires 132 are aligned on the metal electrodes 121 and 122, and after that, the voltage is stopped being applied, the flow of IPA is stopped, and the substrate is heated or left for a certain period of time, and thus, the liquid evaporates and dries, and the silicon nanowires 132 are aligned and secured at equal intervals along the line of electric force between the metal electrodes 121 and 122.

As described above, in the basic configuration of the present invention, it becomes possible to align microscopic structures (silicon nanowires) in the desired locations and in the desired direction with accurate control and high precision. Accordingly, it becomes possible to use microscopic structures as devices so as to make the integrated circuit, display and the like high performance, and in addition, to manufacture microscopic structures with high yield.

First Embodiment

Figure 11:
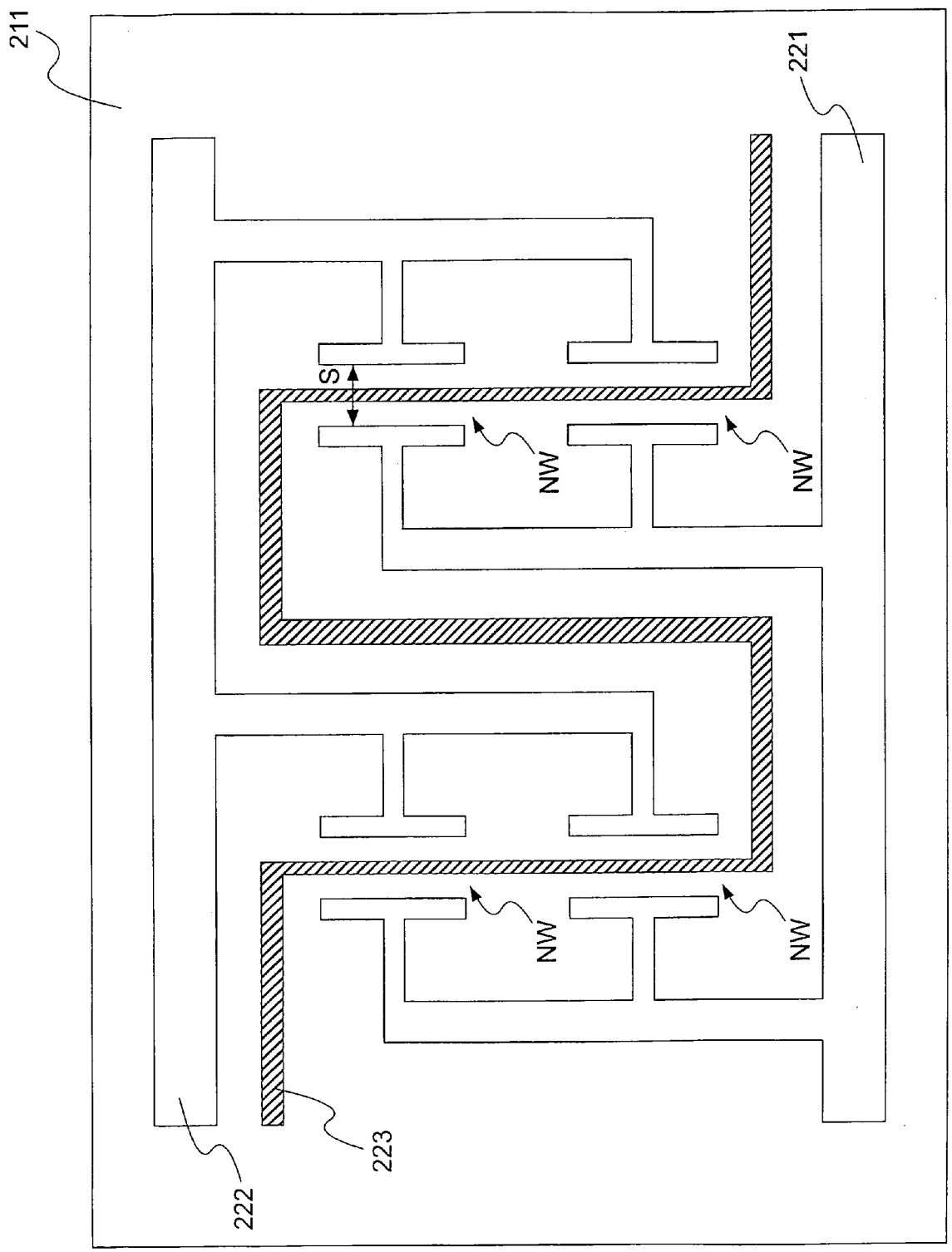
FIG. 11 is a diagram illustrating an insulating substrate used in a first embodiment of the present invention.
Figure 12:
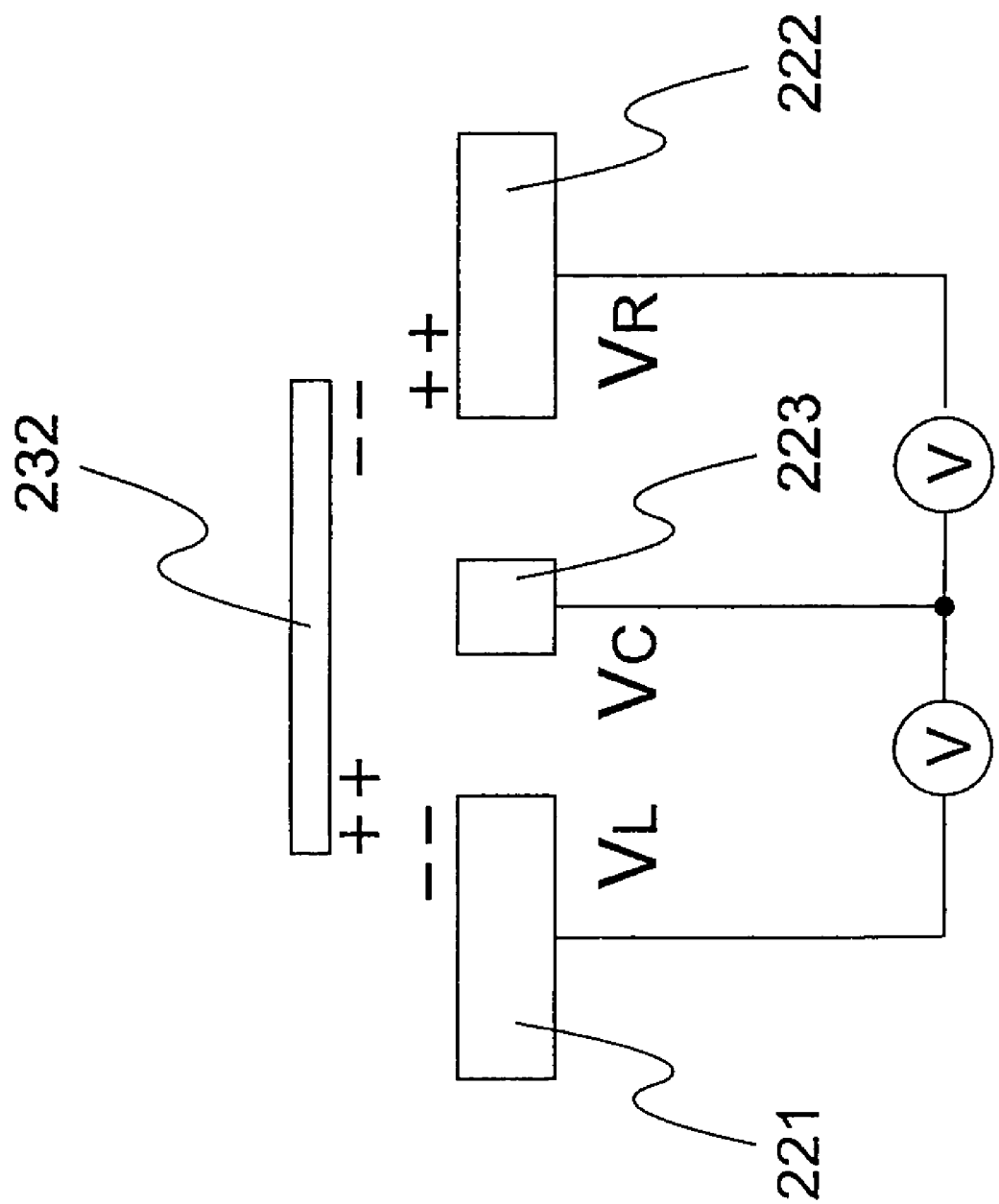
FIG. 12 is a diagram illustrating the principle behind how microscopic structures are aligned in the first embodiment of the present invention.
Figure 13:
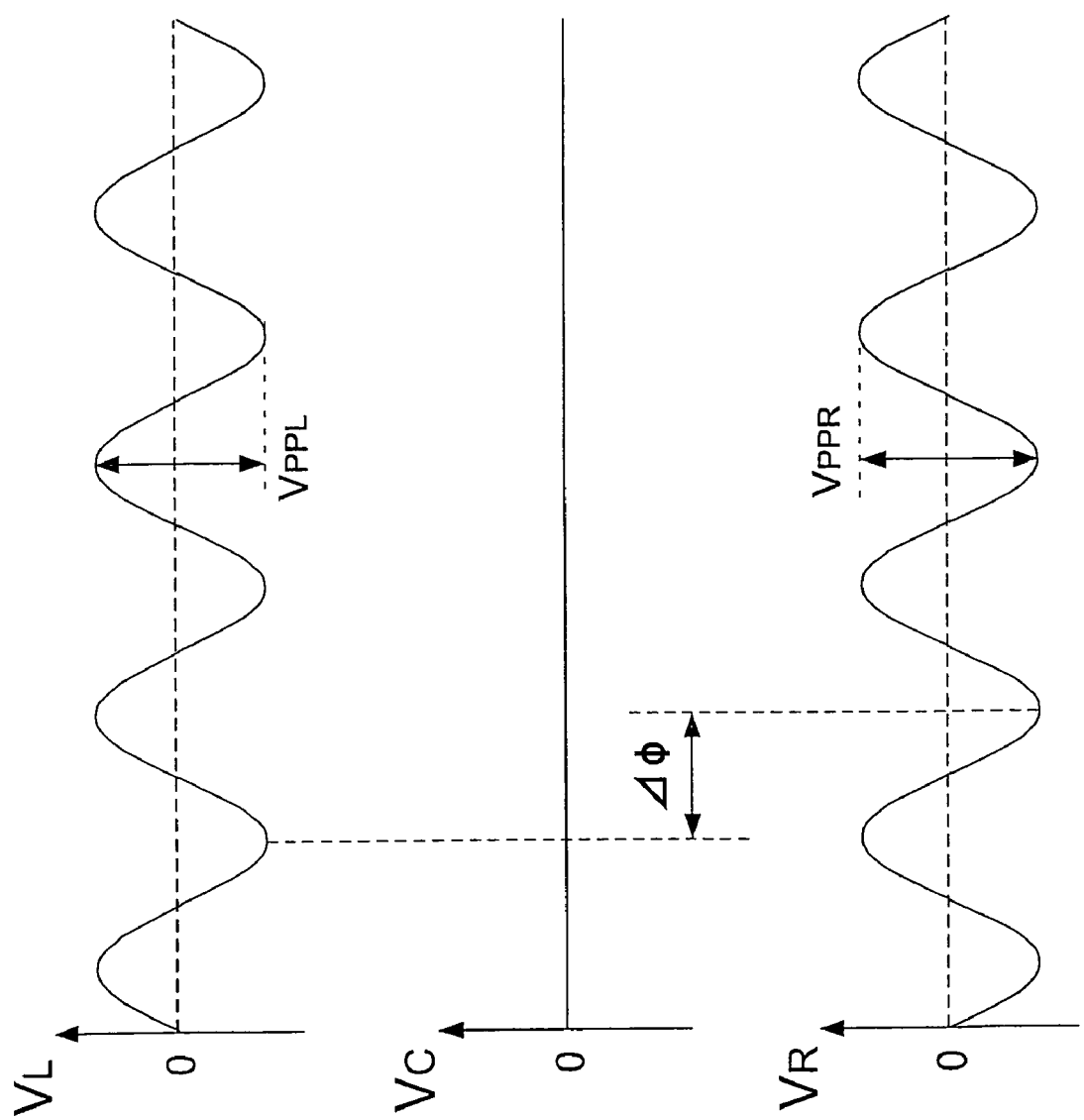
FIG. 13 is a diagram showing a first preferable example of the potentials applied to the electrodes when microscopic structures are aligned in the first embodiment of the present invention.
Figure 14:
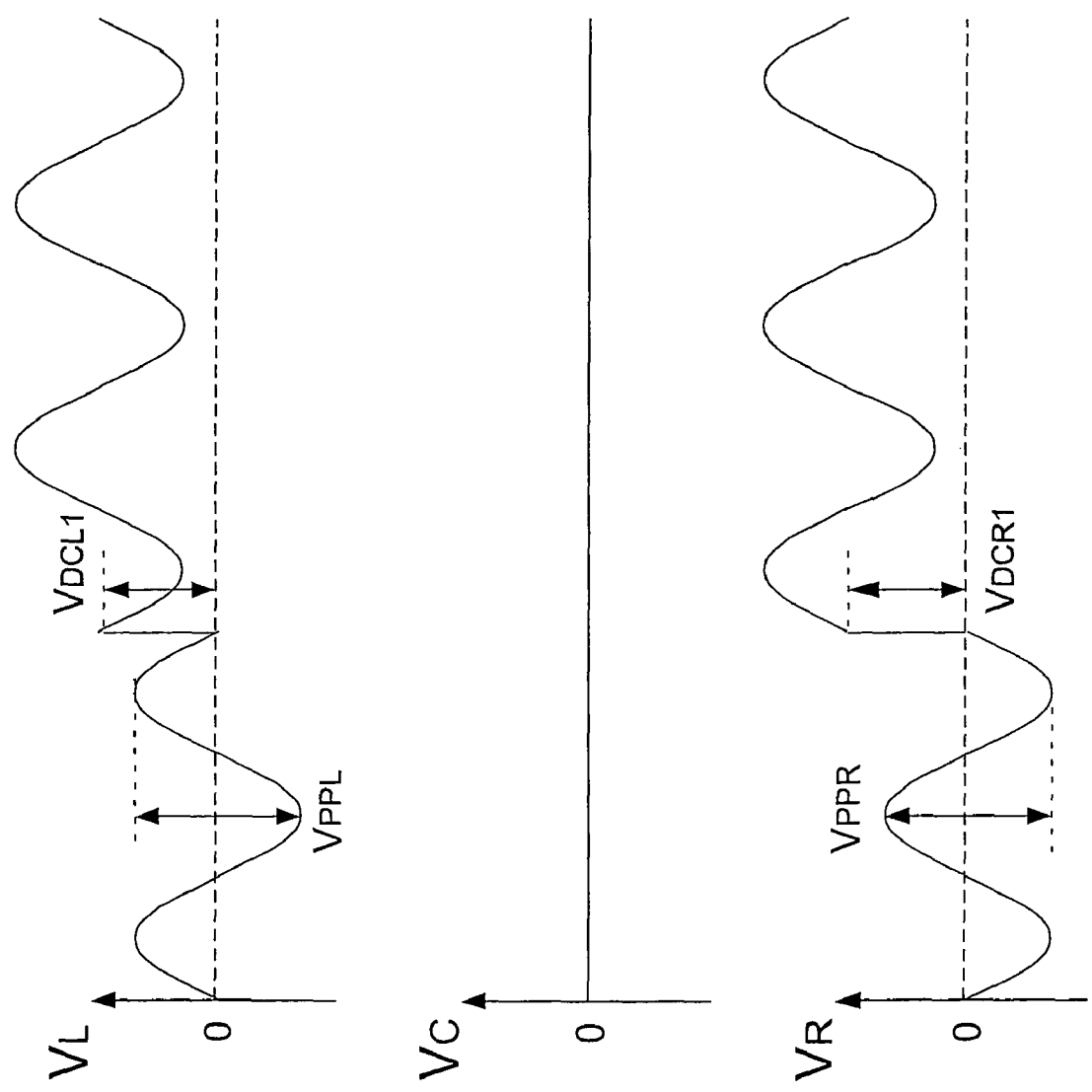
FIG. 14 is a diagram showing a second preferable example of the potentials applied to the electrodes when microscopic structures are aligned in the first embodiment of the present invention.
Figure 15:
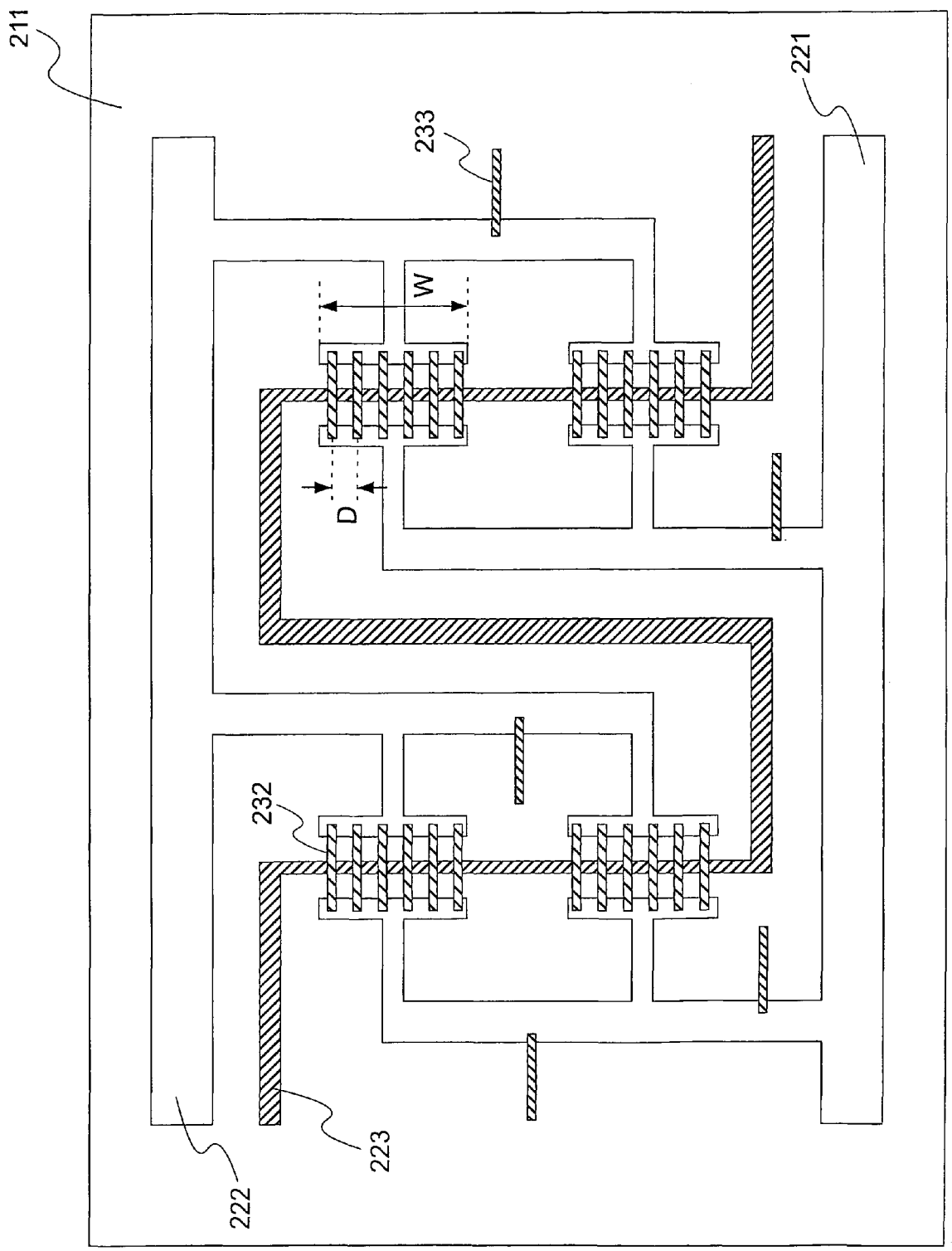
FIG. 15 is a diagram illustrating a state of the microscopic structures when the second preferable potentials are applied to the electrodes in the first embodiment of the present invention.
Figure 16:
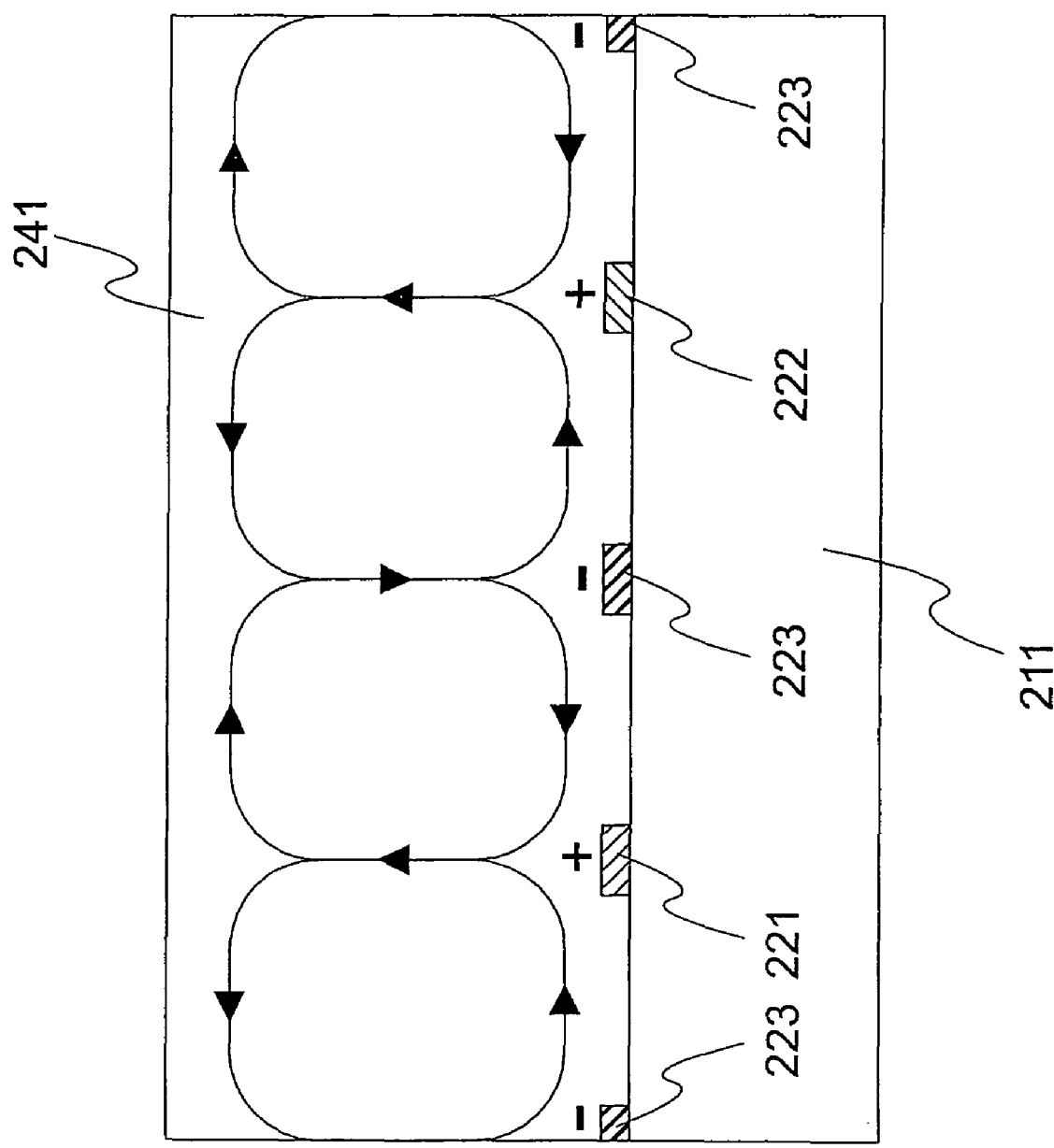
FIG. 16 is a diagram illustrating the principle of the effects gained when the second preferable potentials are applied in the first embodiment of the present invention.
Figure 17:
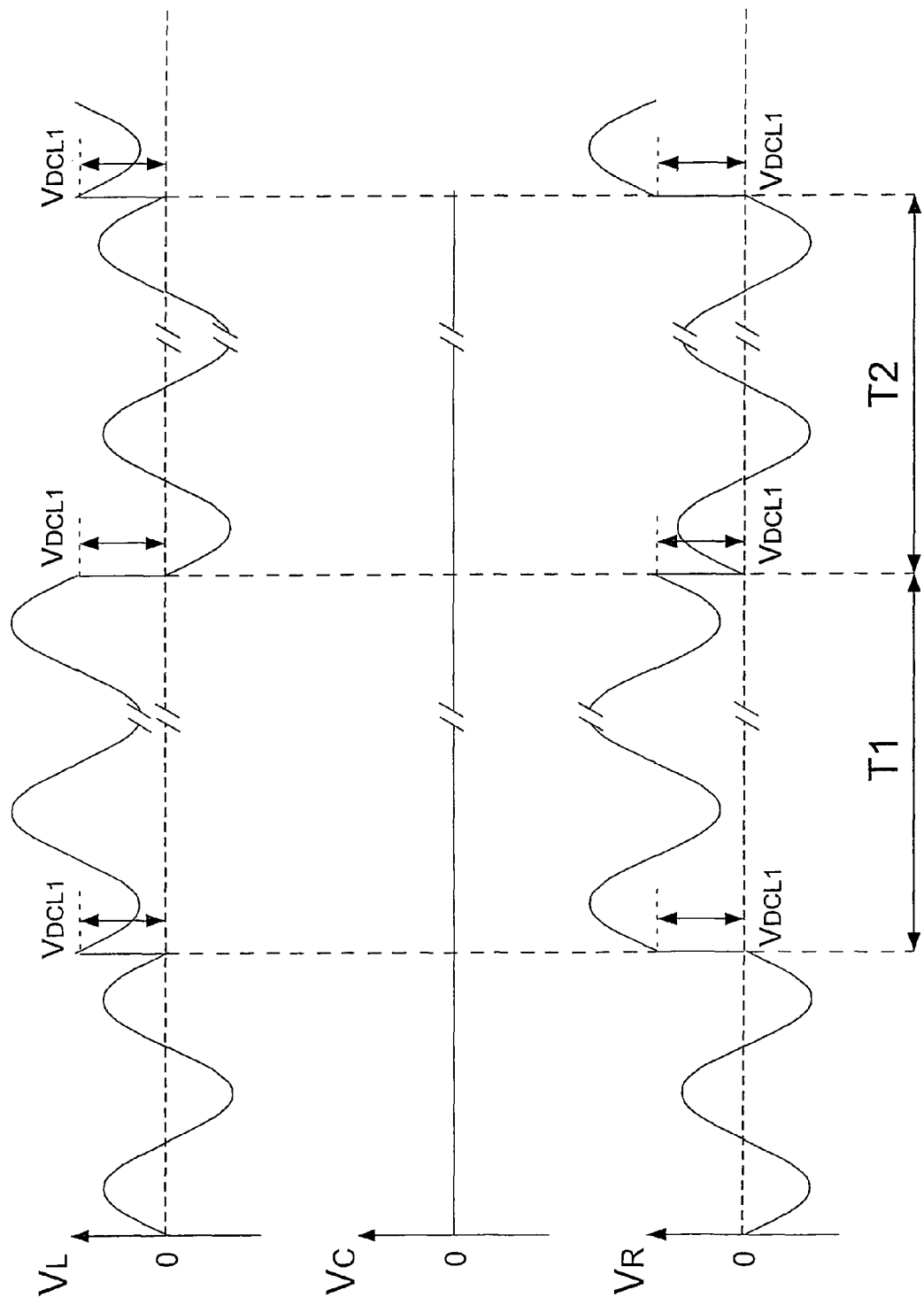
FIG. 17 is a diagram showing a third preferable example of the potentials applied to the electrodes when microscopic structures are aligned in the first embodiment of the present invention.
Figure 18:
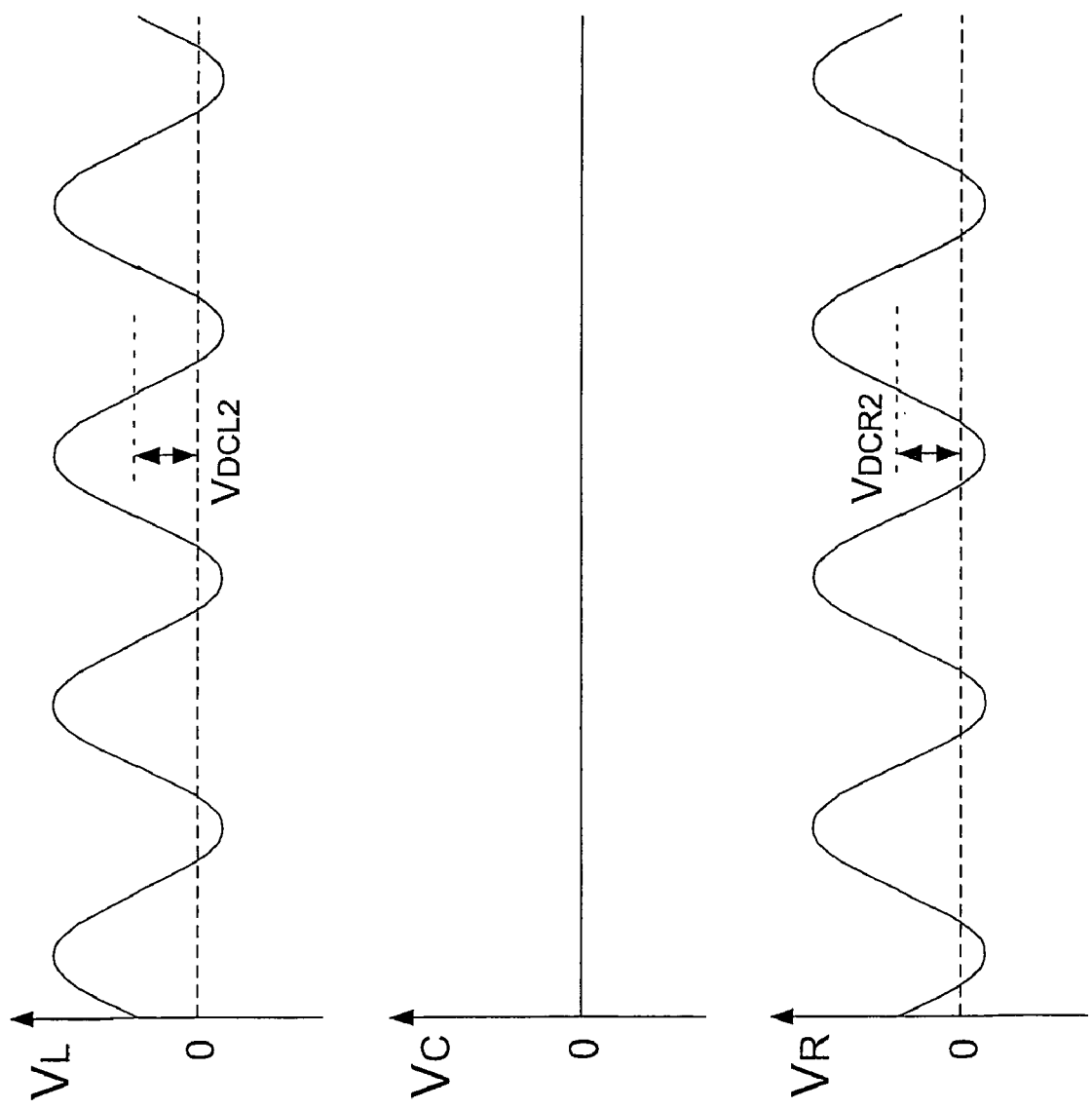
FIG. 18 is a diagram showing a fourth preferable example of the potentials applied to the electrodes when microscopic structures are aligned in the first embodiment of the present invention.

A first embodiment of the present invention is described in reference to FIGS. 11 to 18. FIG. 11 shows an insulating substrate used in the first embodiment. FIG. 12 is a diagram illustrating the principle of the alignment of microscopic structures. FIG. 13 is a diagram showing a first example of preferable potentials to be applied to electrodes when the microscopic structures are aligned. FIG. 14 is a diagram showing a second example of preferable potentials to be applied to the electrodes when the microscopic structures are aligned. FIG. 15 is a diagram illustrating the state of alignment of the microscopic structures at the time when the microscopic structures are aligned. FIG. 16 is a diagram illustrating the principle of the effects gained at the time when the microscopic structures are aligned. FIG. 17 is a diagram showing a third example of preferable potentials to be applied to the electrodes when the microscopic structures are aligned. FIG. 18 is a diagram showing a fourth example of preferable potentials to be applied to the electrodes when the microscopic structures are aligned.

The method for aligning microscopic structures according to the first embodiment of the present invention includes: a substrate forming step of forming one or more microscopic structure-aligning regions having as an unit three electrodes to which independent potentials are applied; a microscopic structure liquid preparing step of dispersing microscopic structures from a nano scale to a micron scale; a microscopic structure applying step of applying the microscopic structure liquid to the insulating substrate; and a microscopic structure aligning step of applying respective voltages to the three electrodes to align the microscopic structures in locations defined by the electrodes. Hereinafter, this is described in detail in reference to the drawings.

FIG. 11 shows an insulating substrate where silicon nanowires are aligned. Metal electrodes 221, 222 and 223 are formed on the surface of an insulating substrate 211. Though not shown in FIG. 11, pads are formed on the metal electrodes 221, 222 and 223 so that potentials can be applied from the outside. Silicon nanowires are aligned in portions where the metal electrodes 221 and 222 face each other (microscopic structure-aligning regions NW in FIG. 11).

Unlike in the case of the above-described basic configuration according to the present invention, the metal electrode 223 is placed between the metal electrodes 221 and 222 in the present embodiment. That is, three electrodes are aligned in the order: the metal electrode 221 (first electrode), 223 (third electrode), 222 (second electrode) in the microscopic structure-aligning regions NW. In other words, the third electrode is located between the first electrode and second electrode in the microscopic structure-aligning regions. Furthermore, the third electrode runs between the first electrode and the second electrode, regardless of whether in the microscopic structure-aligning regions or not.

Though in FIG. 11, 2×2 microscopic structure-aligning regions NW are aligned, any number of regions can, of course, be aligned.

The structures and the forming method of the insulating substrate 211 and the metal electrodes 221, 222 and 223 are the same as in the basic configuration of the present invention. Though the metal electrode 223 is hatched in FIG. 11, this does not have any particular significance, and is simply for the sake of clarity in the drawing.

Here, it is preferable for the distance S between the metal electrodes 221 and 222 to be slightly shorter than the length of the silicon nanowires. In the experiment conducted in the present embodiment, the length of the silicon nanowires was about 25 μm. In the case where the distance S at this time is 16 μm to 22 μm, the silicon nanowires can be aligned most efficiently. That is, the distance S may be about 60 to 90% of the length of the silicon nanowires, and is desirably 80 to 90%.

In order to align silicon nanowires on the insulating substrate 211, in the same manner as in the case of the above-described basic configuration of the present invention, first, IPA in which silicon nanowires are dispersed is thinly applied on the insulating substrate 211. A liquid made of another organic substance, water or the like can be used instead of IPA. The thickness of the applied IPA is the same as in the above-described basic configuration of the present invention. Here, in the case where a large current flows across the metal electrodes 221, 222 and 223 through the liquid, the desired difference in voltage cannot be applied across the metal electrodes 221, 222 and 223. In this case, the entirety of the surface of the insulating substrate 211 may be coated with an insulating film of about 10 to 30 nm so that the metal electrodes 221, 222 and 223 are covered.

Next, a difference in potential is created between the metal electrodes 221, 222 and 223. This is different from in the above-described basic configuration of the present invention in that the freedom in terms of the manner in which voltages can be applied significantly increases due to there being three electrodes. Therefore, it becomes possible to improve the alignment of the silicon nanowires a great deal, as shown below.

FIG. 12 is a diagram illustrating the principle of the alignment of microscopic structures in the first embodiment, where the charge induced in the metal electrodes 221 and 222 ($V_L$ and $V_R$ are applied, respectively) and the charge induced in the silicon nanowires attract each other, and as a result, the silicon nanowires 232 are aligned. In this regard, the principle of the alignment of silicon nanowires is exactly the same as in the case of the above-described basic configuration of the present invention (case where there are two metal electrodes). That is, the metal electrodes 221 and 222 in the first embodiment correspond to the metal electrodes 121 and 122, respectively, in the above-described basic configuration of the present invention. In addition, a potential $V_C$ can be independently applied to the metal electrode 223. Hereinafter, examples of preferable potentials to be applied between the metal electrodes 221, 222 and 223 are described.

(First Example of Preferable Potentials)

A first example of preferable potentials in the first embodiment of the present invention is shown in FIG. 13. A reference potential is applied to the metal electrode 223 (third electrode), and an alternating current potential is applied to the metal electrodes 221 (first electrode) and 222 (second electrode). When AC potentials are applied in this manner, the alignment can be stabilized even in the case where the microscopic structures are not electrically neutral but charged positively or negatively as a whole.

The preferable frequency is 10 Hz to 1 MHz, as in the case of the basic configuration of the present invention, and it is more preferable for the frequency to be 50 Hz to 1 kHz. The reason for this is the same as described for the basic structure of the present invention. It is preferable for the difference in the applied potential between the metal electrode 223 and the metal electrodes 221 and 222 to be 0.1 to 10 V. In the case of 0.1 V or lower, the alignment of silicon nanowires becomes poor, while in the case of 10 V or higher, the insulation between the metal electrodes becomes a problem. Accordingly, 1 V to 5 V is preferable, and furthermore, it is preferable for the difference in potential to be about 1 V.

In addition, it is preferable for the alternating current potential applied to the metal electrodes 221 (first electrode) and 222 (second electrode) to have the same frequency and a phase difference (Δϕ) of 150 to 210°. FIG. 13 shows a case where there is a phase difference of 180°. In the example of FIG. 13, the amplitude of the alternating current applied to the metal electrodes 221 (first electrode) and 222 (second electrode) is $V_{PPL}/2$ and $V_{PPR}/2$, respectively.

However, the relative voltage applied to the metal electrodes 221 (first electrode) and 222 (second electrode) becomes $V_{PPL}/2+V_{PPR}/2$. In the case of $V_{PPL}=V_{PPR}$, $V_{PPL}/2+V_{PPR}/2=V_{PPL}$ and the effective difference in potential doubles. That is, the intensity of the electrical field required for alignment can be secured even when the amplitude of the alternating current applied to the metal electrodes 221 (first electrode) and 222 (second electrode) is ½.

Meanwhile, the voltage applied to each electrode becomes ½, and therefore, it becomes possible to greatly reduce the number of silicon nanowires 133 adsorbed in the unpreferred locations, as shown in FIG. 6, in the basic configuration of the present invention. It is not necessary for Δϕ to be 180°, and sufficient effects can be gained when it is in a range from 150 to 210°.

As described above, when the first example of preferable potentials is adopted, microscopic structures can be aligned uniformly in a broad range in desired locations at equal intervals in the same direction. Thereafter, the voltages are stopped being applied, in the same manner as in the case of the basic configuration of the present invention, and the substrate is heated or left for a certain period of time so that the liquid evaporates and dries, and thus, the silicon nanowires 132 are aligned and secured between the metal electrodes 121 and 122.

(Second Example of Preferable Potentials)

FIG. 14 shows a second example of preferable potentials in the first embodiment of the present invention. First, a reference potential is applied to the metal electrodes 223 (third electrode) and potentials different form the reference potential (here, alternating current potentials) are applied to the metal electrodes 221 (first electrode) and 222 (second electrode), as in the first example of preferable potentials, so that the silicon nanowires are aligned. At this time, as shown in FIG. 15, silicon nanowires 232 are aligned between the metal electrodes 221 (first electrode) and 222 (second electrode), and in addition, there are silicon nanowires 233 which are adsorbed in unpreferred locations.

Here, offset voltages ($V_{DCL1}$, $V_{DCR1}$) are applied simultaneously to the metal electrodes 221 (first electrode) and 222 (second electrode), respectively. As a result, it is possible to remove only silicon nanowires 233 adsorbed in unpreferred locations while the silicon nanowires 232 remain aligned between the electrodes.

In the second example of preferable potentials, $V_{PPL}=V_{PPR}=0.5$ and $V_{DCL1}=V_{DCR1}=0.3$ V. In this case, it can be observed that silicon nanowires 233 adsorbed in unpreferred locations are separated from the electrodes with great force. Meanwhile, the silicon wires 232 aligned between the electrodes slightly move over the electrodes but become stable after a while, and do not break the alignment. Here, in the case of $V_{DCL1}=V_{DCR1}=-0.3$ V, the silicon nanowires 232 are aligned between the electrodes, and it is possible to remove only silicon nanowires 233 adsorbed in unpreferred locations.

Here, 0.1 to 5 V can be applied as $V_{PPL}=V_{PPR}$ in a preferable range, and 0.3 to 2 V is more preferable. In addition, 0.1 to 3 V can be applied as $V_{DCL1}=V_{DCR1}$ in a preferable range, and 0.05 to 1 V is more preferable.

Though the flow of IPA is used to remove the silicon nanowires 133 adsorbed in unpreferred locations in the basic configuration of the present invention, the silicon nanowires 233 adsorbed in the unpreferred locations are electrically removed in the present the first embodiment. This is a method, which is particularly appropriate to align microscopic structures in a broad area. This is because very minute control is required to make the flow of IPA uniform in a broad area, and an appropriate pattern of electrodes can be designed in order to generate an electrical field having the same intensity in a broad area very easily.

Though the mechanism for removing only the silicon nanowires 233 adsorbed in the unpreferred locations is not completely clear, as described above, removal is considered to be possible for the following reasons. FIG. 16 is a diagram illustrating the mechanism. The metal electrode 221 (first electrode) and the metal electrode 222 (second electrode) are formed on the insulating substrate 211. Furthermore, a metal electrode 223 (third electrode) is formed between the metal electrodes 221 and 222.

Here, in the case where an offset voltage is applied, as shown in FIG. 14, it can be presumed that a relatively positive DC component is applied to the metal electrode 221 and the metal electrode 222 (first electrode and second electrode), and a relatively negative DC component is applied to the metal electrode 223, as shown in FIG. 16, when the AC component is ignored. As a result, a slightly amount of ions in IPA flows from one electrode to another, causing a convection current in the IPA. This convection current removes the silicon nanowires 233 adsorbed in the unpreferred locations. The movement of silicon nanowires after removal observed in the experiment suggests that there is a convection current, as sketched in FIG. 16. Here, reversal of the direction of the convection current in the IPA could be confirmed when the polarity of the offset voltage was reversed.

Though the silicon nanowires 233 adsorbed in the unpreferred locations can be removed using the convection current in the IPA, nanowires 232 aligned in microscopic structure-aligning regions have a relatively strong force of adsorption, and therefore, are not removed by the convection current in the IPA. It is considered that only silicon nanowires 233 adsorbed in the unpreferred locations can be removed through the above-described mechanism.

As can be deduced from the above-described principle, it is necessary to cause a convection current in the IPA in order to remove silicon nanowires 233 adsorbed in the unpreferred locations. Thus, a current which flows through the IPA is required. Accordingly, it is preferable for the metal electrodes 221, 222 and 223 to make direct contact with the IPA or make contact with the IPA through an extremely thin insulating film (for example of 5 nm or less) through which a tunnel current can flow. Actually, in the case where the metal electrodes 221, 222 and 223 are coated with a silicon oxide film of 100 nm, no convection current is created in the IPA. Here, even in this case, silicon nanowires can be aligned in the microscopic structure-aligning regions.

As described above, it becomes possible to align microscopic structures only in desired location uniformly in a broad area by adopting the second example of preferable potentials.

Here, it is not necessary for the offset voltages ($V_{DCL1}$, $V_{DCR1}$) to be applied to the metal electrodes 221 (first electrode) and 222 (second electrode) with precisely the same timing. Here, in the case where a state where the offset voltage is applied only to the metal electrode on one side lasts long, the alignment of the silicon nanowires 232 aligned between the electrodes is greatly disturbed. Accordingly, it is preferable for the time difference in the application of the offset voltages to the metal electrodes 221 (first electrode) and 222 (second electrode) to be 0.1 second or less.

Furthermore, it is not necessary for the offset voltages ($V_{DCL1}$, $V_{DCR1}$) applied to the metal electrodes 221 (first electrode) and 222 (second electrode) to be exactly the same. Here, in the case where $V_{DCL1}$ and $V_{DCR1}$ are greatly different, the alignment of the silicon nanowires 232 aligned between the electrodes is greatly disturbed. Accordingly, it is most preferable for the offset voltages applied to the first and second electrodes to be equal. Furthermore, the offset voltages ($V_{DCL1}$, $V_{DCR1}$) may be applied so as to superpose with an alternating current voltage, or after the application of an alternating current voltage.

After that, the voltages are stopped being applied and the substrate is heated or left for a certain period of time so that the liquid is removed, and thus, the silicon nanowires are aligned and secured between the metal electrodes.

(Third Example of Preferable Potentials)

FIG. 17 shows a third example of preferable potentials in the first embodiment of the present invention. This example is different from the second example of preferable potentials in that the operation for applying offset voltages ($V_{DCL1}$, $V_{DCR1}$) to the metal electrodes 221 (first electrode) and 222 (second electrode) is repeated. Other parts in the configuration are the same as in the first example of preferable potentials and the second example of preferable potentials.

When the third example of preferable potentials is adopted, the same effects can, of course, be gained as in the second example of preferred potentials. In addition to these, the below described effects can be provided.

In this example, the operation for applying offset voltages ($V_{DCL1}$, $V_{DCR1}$) to the metal electrodes 221 (first electrode) and 222 (second electrode) is repeated, and therefore, silicon nanowires are not adsorbed in unpreferred locations, but float between the electrodes and aligned there. Therefore, the time required for alignment can be greatly shortened.

In the experiment where no operation for applying offset voltages is carried out at all, approximately three silicon nanowires were adsorbed between the electrodes (width W=40 μm, as shown in FIG. 15) when a voltage was kept being applied for 7 minutes ($V_{PPL}=V_{PPR}=0.5$ V, 100 Hz). Meanwhile, in the case where an operation for applying offset voltages was repeated at a rate of once every eight seconds ($V_{DCL1}=V_{DCR1}=0.3$ V), ten or more silicon nanowires were adsorbed between the electrodes. FIG. 15 shows only six silicon nanowires.

As described above, it becomes possible to greatly shorten the time required for the alignment of microscopic structures by adopting the third example of preferable potentials.

Here, it is preferable for the intervals (T1, T2) between operations for applying offset voltages to the metal electrodes 221 (first electrode) and 222 (second electrode) to be 1 to 10 seconds. In the case where T1 and T2 are less than 1 second, torque works on the silicon nanowires 233 adsorbed in unpreferred locations in the opposite direction before the silicon nanowires 233 are sufficiently separated from the electrodes, and as a result, a phenomenon where silicon nanowires vibrate in the vicinity of the electrodes can be observed. In this case, silicon nanowires 233 adsorbed in the unpreferred locations cannot be removed. Meanwhile, in the case where T1 and T2 exceed 10 seconds, a phenomenon where silicon nanowires 233 that have once separated from the electrodes are re-adsorbed by the electrodes can be observed. In this case, the efficiency with which the silicon nanowires float to preferred locations (between the electrodes) and are aligned there becomes low. Therefore, T1 and T2 may be set to 1 to 10 seconds, and thus, effects of greatly shortening the time required for alignment of microscopic structures can be gained to the maximum.

(Fourth Example of Preferable Potentials)

FIG. 18 shows the fourth example of preferable potentials in the first embodiment of the present invention. This example is different from the first example of preferable potentials in that the average of the potentials applied to the metal electrode 221 (first electrode) and the metal electrode 222 (second electrode) is different from the reference potential applied to the metal electrode 223 (third electrode) ($V_{DCL2}$, $V_{DCR2}$).

The inventors have found that the intervals D (see FIG. 15) between silicon nanowires increase when $V_{DCL2}$ and $V_{DCR2}$ are positive, and D (see FIG. 15) decreases when $V_{DCL2}$ and $V_{DCR2}$ are negative. It seems that when $V_{DCL2}=V_{DCR2}=+0.3$ V, D is about 3.5 μm, and when $V_{DCL2}=V_{DCR2}=-0.3$ V, D is about 2.5 μm.

As described above, the average of the potentials applied to the metal electrode 221 (first electrode) and the metal electrode 223 (third electrode) is different from the reference potential applied to the metal electrode 222 (second electrode), and thus, it becomes possible to control the density with which the microscopic structures are aligned. +/−0.1 to 2 V is a preferable range for $V_{DCL2}=V_{DCR2}$, and it is more preferable for $V_{DCL2}=V_{DCR2}$ to be 0.2 to 0.6 V.

This seems to relate to the creation of a convection current in the IPA, as shown in FIG. 16. The distances between the metal electrodes 221 and 222 (first and second electrodes) and the metal electrode 223 are very small in comparison with other locations in the microscopic structure-aligning regions. Therefore, it is considered that the direction of the convection current changes so as to provide effects of making the silicon nanowires approach each other or move away from each other.

Second Embodiment

Figure 19:
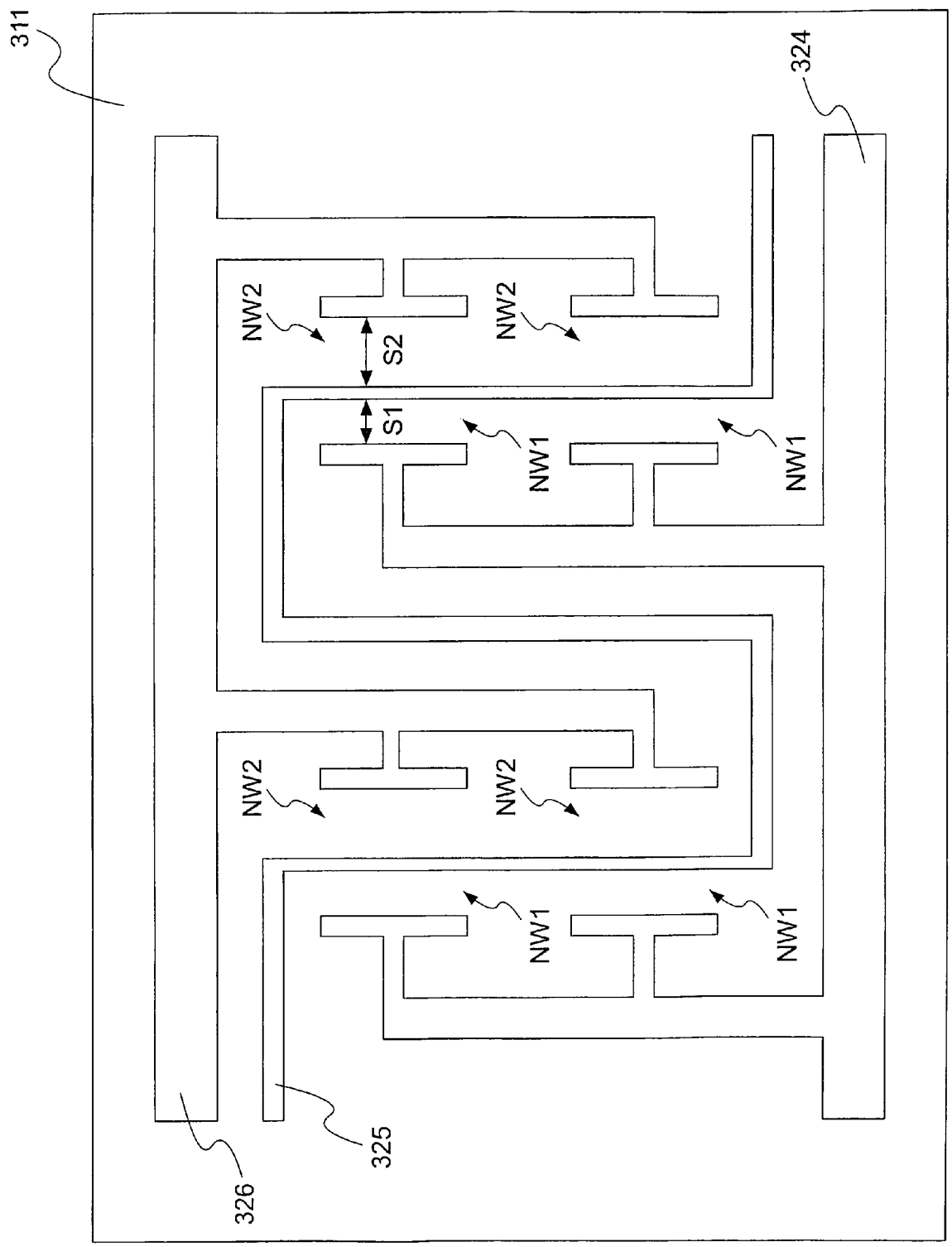
FIG. 19 is a diagram illustrating an insulating substrate used in a second embodiment of the present invention.
Figure 22:
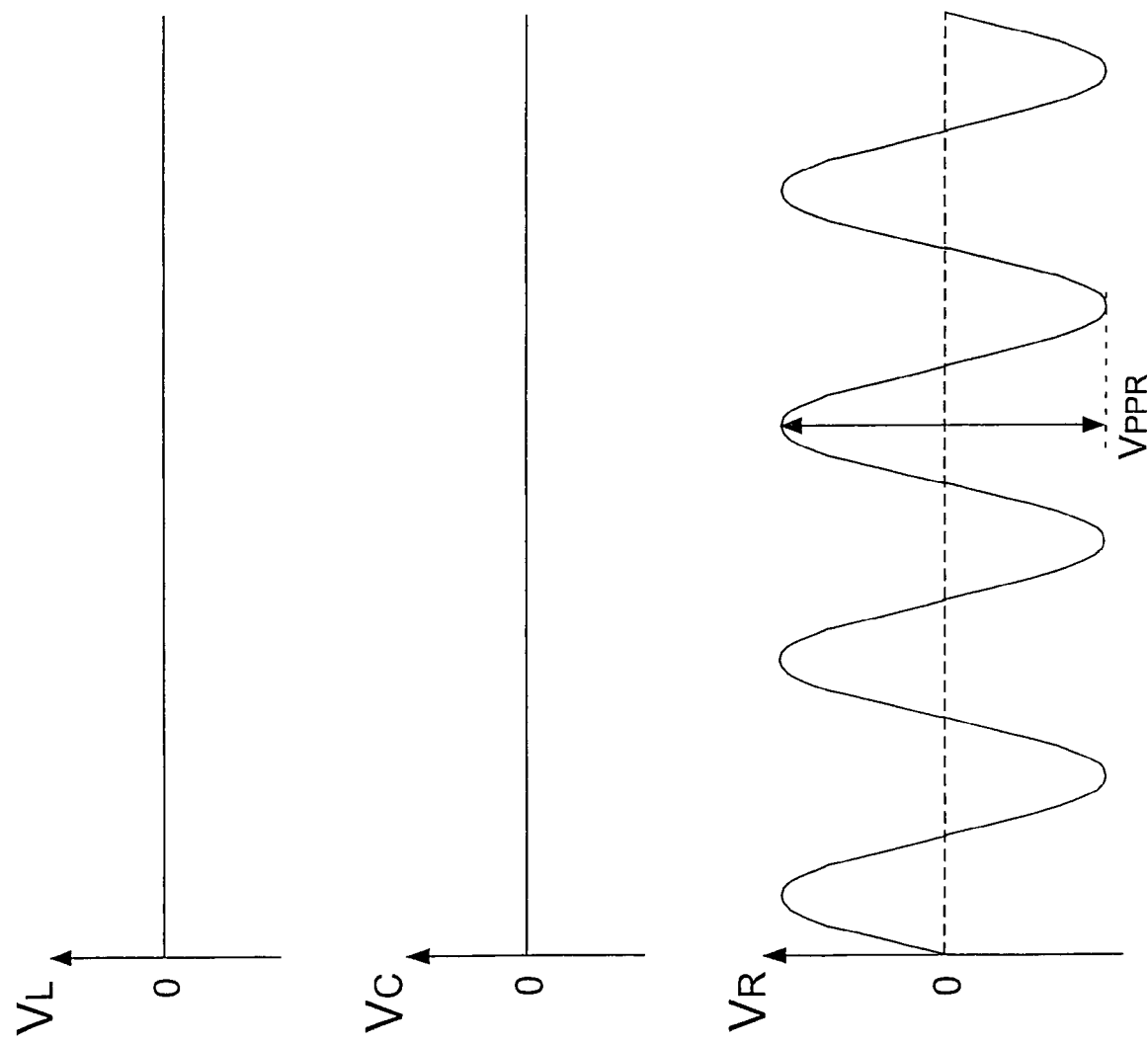
FIG. 22 is a diagram illustrating preferable potentials applied to the electrodes in a second microscopic structure aligning step in the second embodiment of the present invention.
Figure 23:
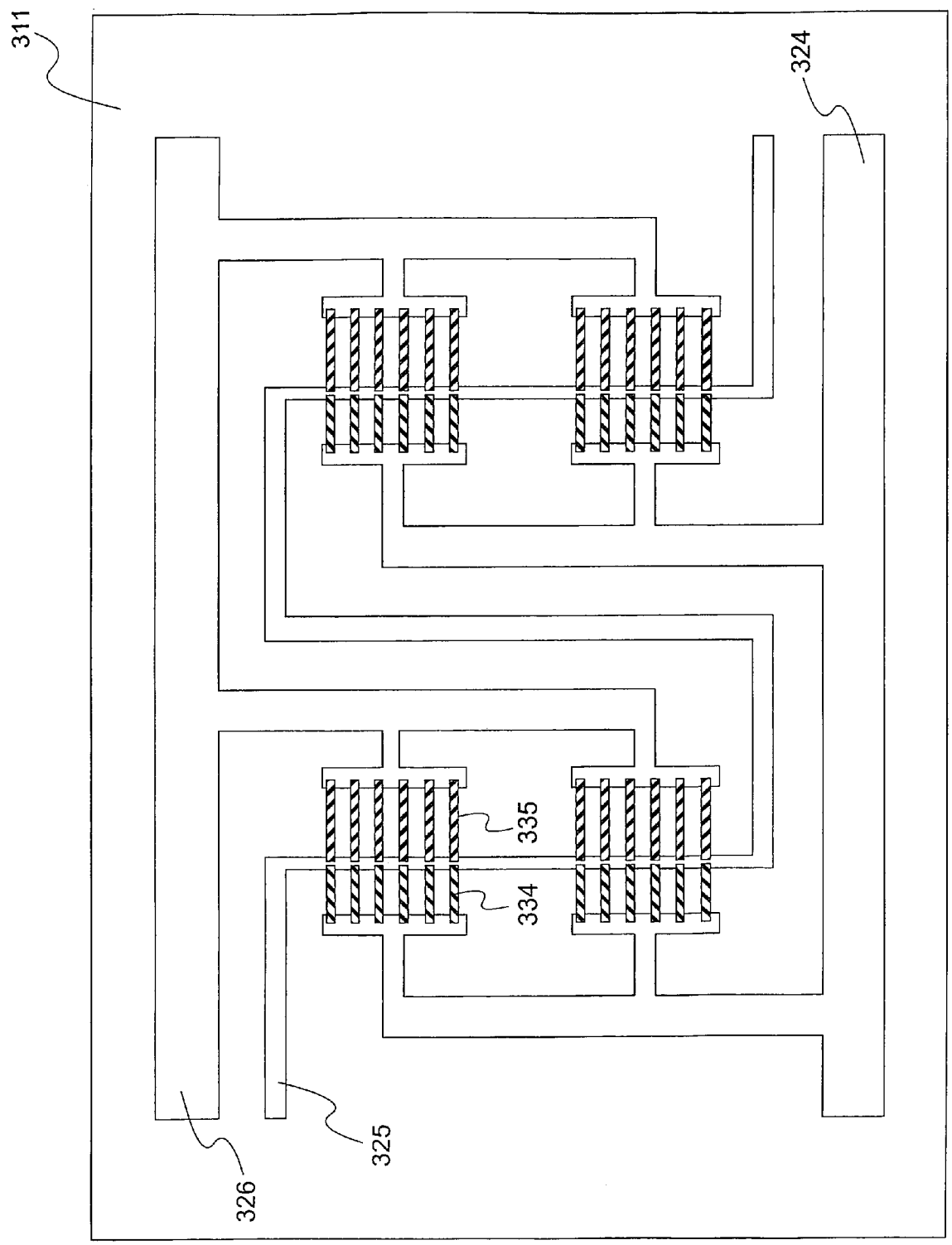
FIG. 23 is a diagram showing the state where the microscopic structures are aligned after the second microscopic structure aligning step in the second embodiment of the present invention.
Figure 24:
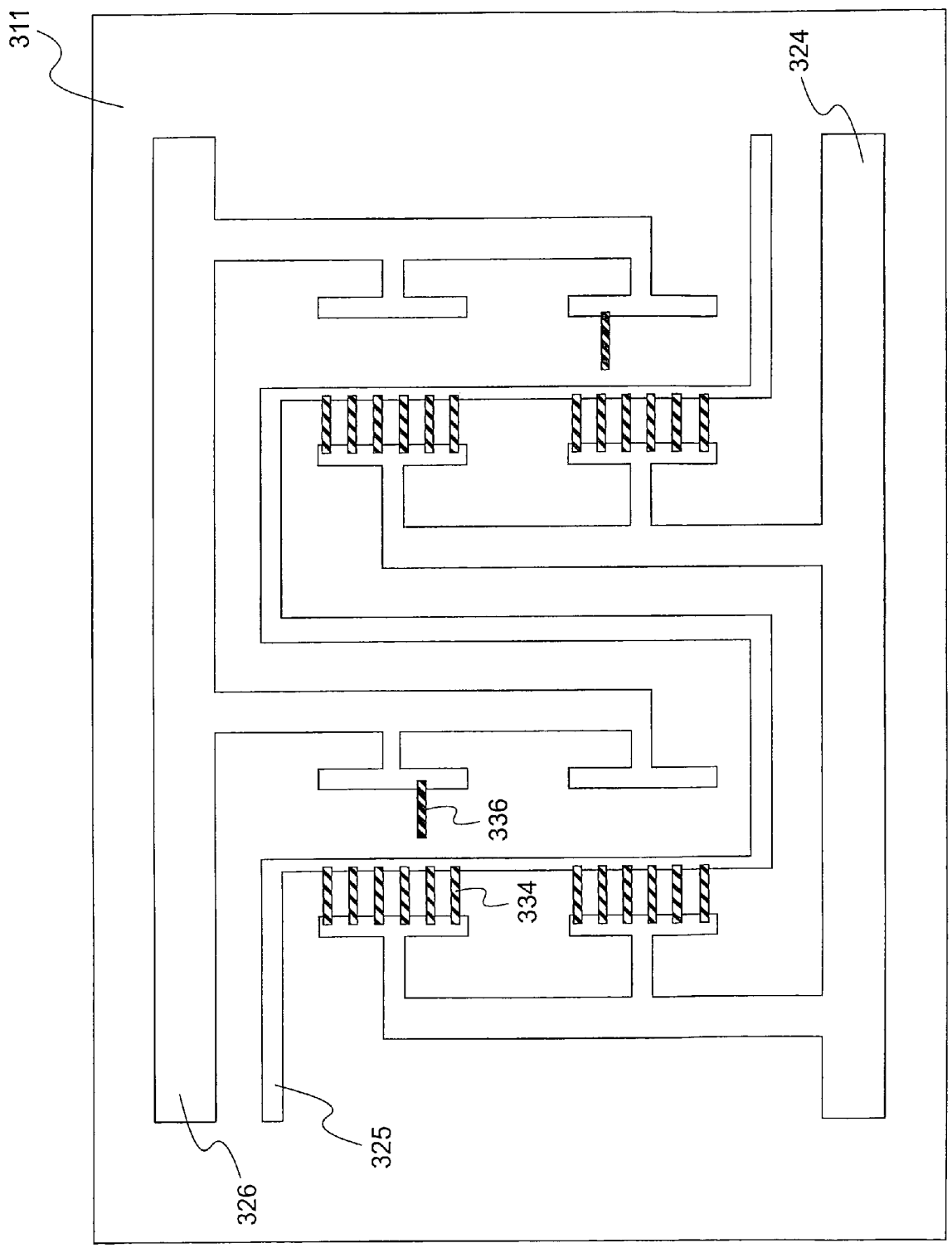
FIG. 24 is a diagram showing the state where microscopic structures are aligned in the case where microscopic structures are adsorbed in unpreferred locations after the first microscopic structure aligning step in the second embodiment of the present invention.
Figure 25:
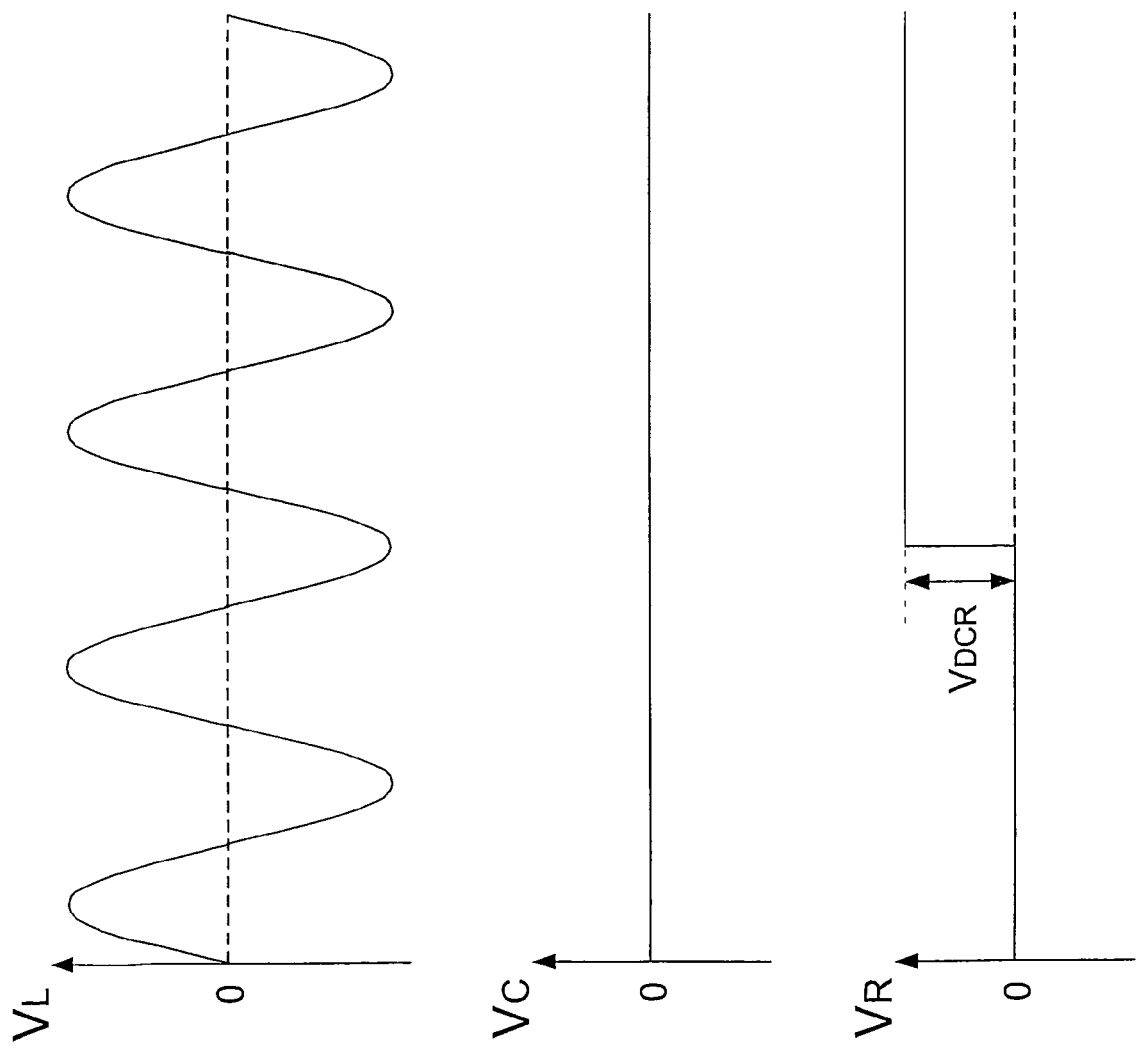
FIG. 25 is a diagram illustrating preferable potentials to be applied to the electrodes, which are appropriate for removing microscopic structures which are adsorbed in unpreferred locations in FIG. 24.

A second embodiment of the present invention is described in reference to FIGS. 19 to 25. FIG. 19 shows an insulating substrate used in the present embodiment. FIGS. 20 to 23 are diagrams illustrating the procedure of the method for aligning microscopic structures according to the present embodiment. FIG. 24 is a diagram showing the state during the process for aligning microscopic structures in the present embodiment. FIG. 25 is a diagram illustrating preferable potentials to be applied to the electrodes in the state in FIG. 24.

The method for aligning microscopic structures according to the second embodiment of the present invention includes a substrate preparing step of preparing an insulating substrate where one or more microscopic structure-aligning regions having as an unit fourth, fifth and sixth electrodes to which independent potentials are applied are formed; a microscopic structure applying step of applying a liquid including microscopic structures ranging from a nano scale to a micron scale on the insulating substrate; and a microscopic structure aligning step of applying voltages to the three electrodes to align the microscopic structures in the microscopic structure-aligning regions defined by the electrodes, wherein the microscopic structure aligning step includes a first microscopic structure aligning step of aligning first microscopic structures across the fourth and fifth electrodes and a second microscopic structure aligning step of aligning second microscopic structures across the fifth and sixth electrodes, and in the first microscopic structure aligning step, a reference potential is applied to the fifth and sixth electrodes and a potential different from the reference potential is applied to the fourth electrode, while in the second microscopic structure aligning step, a reference potential is applied to the fourth and fifth electrodes and a potential different from the reference potential is applied to the sixth electrode.

Put simply, the method for arranging microscopic structures according to the present invention is a method for selectively aligning two types of microscopic structures in desired locations. Hereinafter, this is described in detail in reference to the drawings.

FIG. 19 shows an insulating substrate where silicon nanowires are aligned. Metal electrodes 324, 325 and 326 are formed on the surface of the insulating substrate 311. Though not shown in FIG. 19, pads are formed on the metal electrodes 324, 325 and 326 so that potentials can be applied from the outside. First silicon nanowires are aligned in portions where the metal electrodes 324 and 325 face each other (microscopic structure-aligning regions NW1 in FIG. 19), and second silicon nanowires are aligned in portions where metal electrodes 325 and 326 face each other (microscopic structure-aligning regions NW2 in FIG. 19). Though in FIG. 19, 2×2 microscopic structure-aligning regions NW1 and NW2 are aligned, any number of regions can, of course, be aligned.

This insulating substrate and the structure and method for forming metal electrodes are the same as described in the basic configuration of the present invention.

Here, it is preferable for a distance S1 between the metal electrodes 324 and 325 to be slightly less than the length of the first silicon nanowires, and it is preferable for the distance S2 between the metal electrodes 325 and 326 to be slightly less than the length of the second silicon nanowires, which is the same as in the basic configuration of the present invention.

The following procedure, for example, may be carried out in order to align the first silicon nanowires on the insulating substrate 311. First, IPA including first silicon nanowires is thinly applied to the insulating substrate 311. A liquid made of another organic substance, water or the like can be used instead of IPA. The applied liquid and the thickness to which this liquid is applied are the same as in the basic configuration of the present invention. Here, in the case where a large current flows across the metal electrodes 324, 325 and 326 through the liquid, the desired difference in voltage cannot be created across the metal electrodes 324, 325 and 326. In this case, the entirety of the surface of the insulating substrate 311 may be coated with an insulating film of about 10 to 30 nm so that the metal electrodes 324, 325 and 326 are covered.

Figure 20:
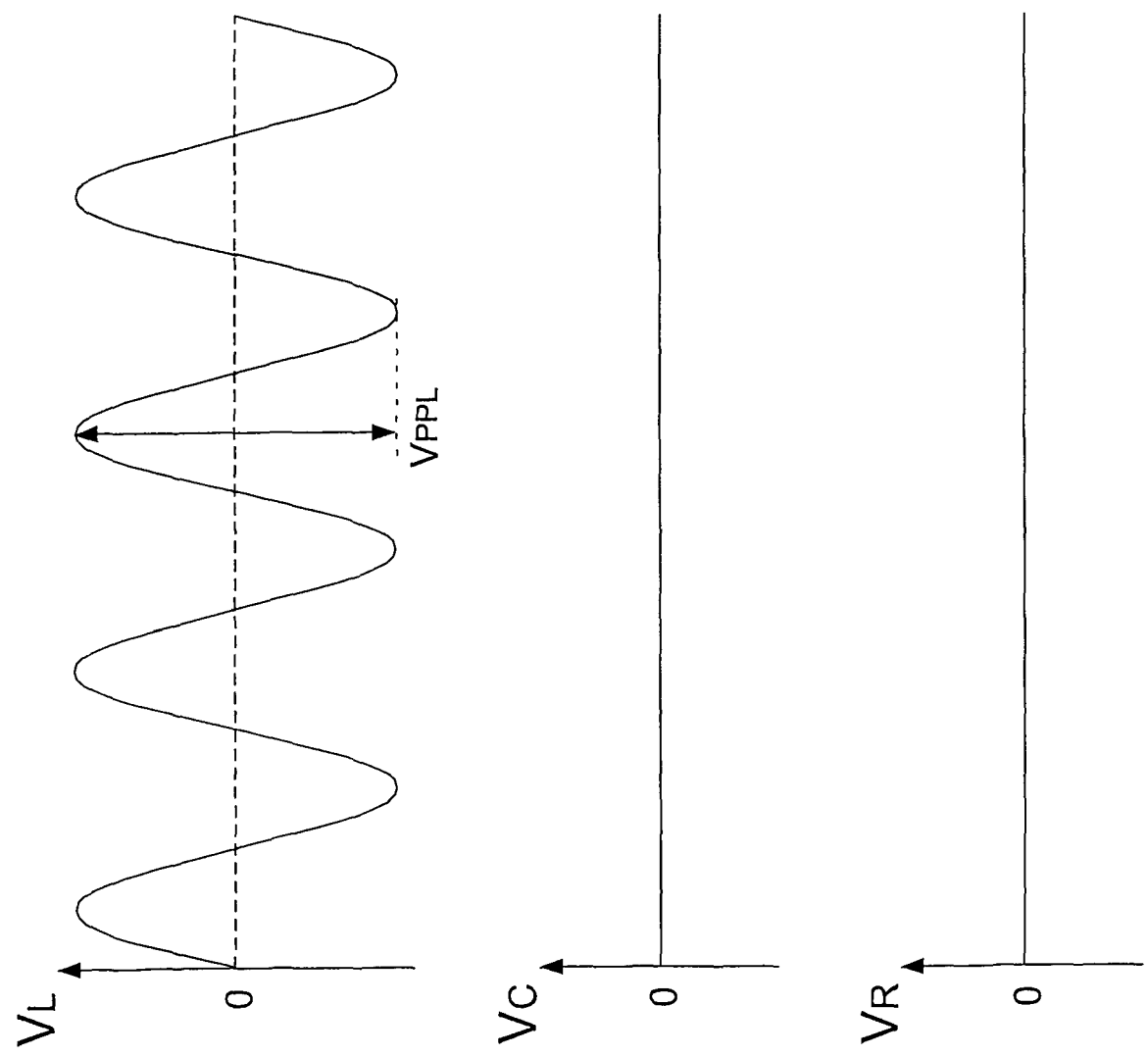
FIG. 20 is a diagram illustrating preferable potentials applied to the electrodes in a first microscopic structure aligning step in the second embodiment of the present invention.
Figure 21:
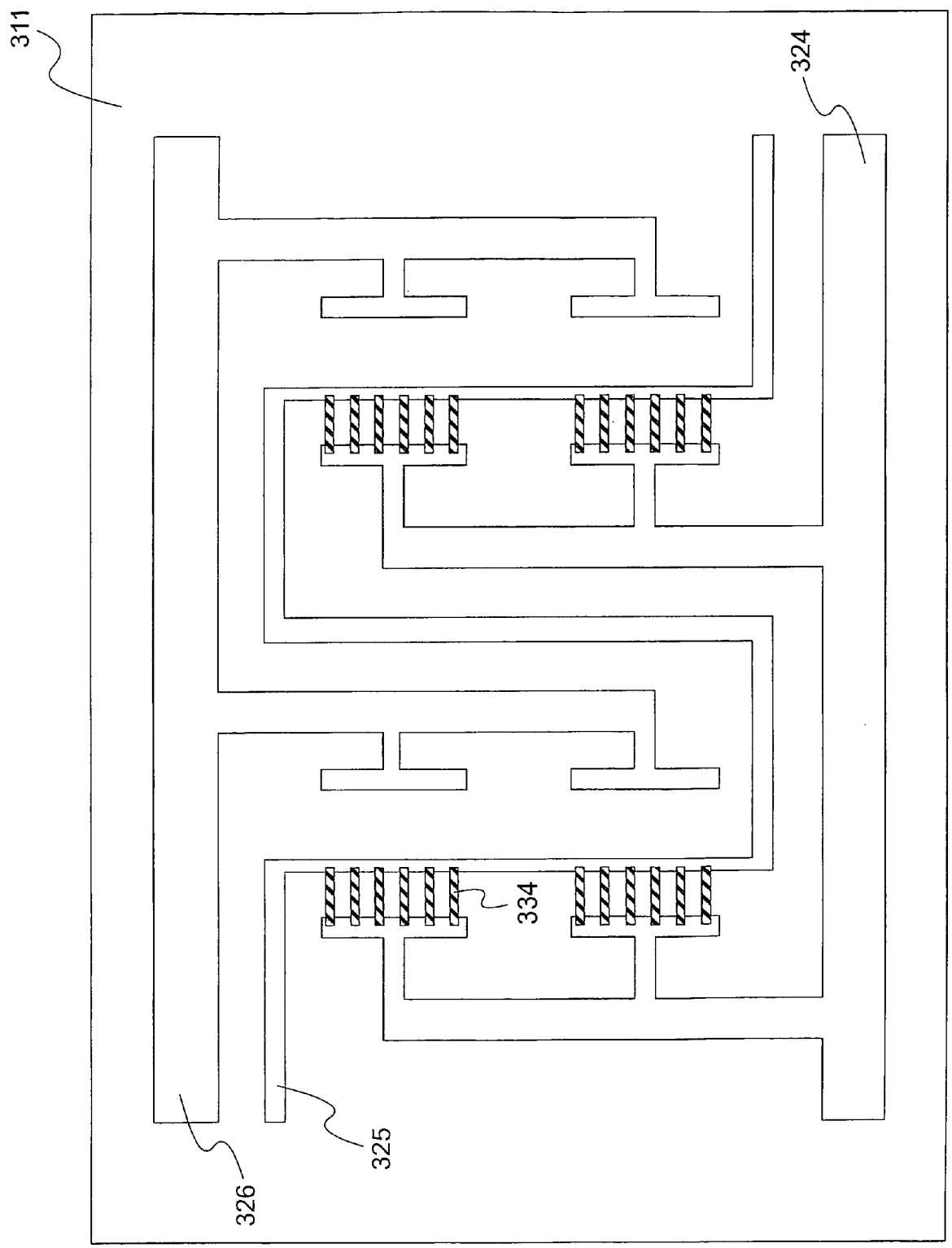
FIG. 21 is a diagram showing a state where the microscopic structures are aligned after the first microscopic structure aligning step in the second embodiment of the present invention.

Next, voltages are applied to the metal electrodes 324, 325 and 326. FIG. 20 shows an example of preferable potentials to be applied to the metal electrodes 324 (fourth electrode), 325 (fifth electrode) and 326 (sixth electrode) ($V_L$, $V_C$ and $V_R$, respectively). A reference voltage is applied to the metal electrodes 325 and 326, and an alternating current voltage with an amplitude of $V_{PPL}/2$ is applied to the metal electrode 324. An alternating current voltage with an amplitude of $V_{PPL}/2$ is applied across the metal electrodes 324 and 325. Therefore, as shown in FIG. 21, first silicon nanowires 334 are aligned in portions where the metal electrodes 324 and 325 face each other. Meanwhile, no voltage is applied across the metal electrodes 325 and 326. Therefore, no silicon nanowires are aligned in portions where the metal electrodes 325 and 326 face each other. The above description is the first microscopic structure aligning step.

Next, the first silicon nanowires 334 are secured to the substrate by drying the substrate. After that, IPA including second silicon nanowires is thinly applied on the insulating substrate 311.

Next, a voltage is applied to the metal electrodes 324, 325 and 326. FIG. 22 shows an example of preferable potentials to be applied to across the metal electrodes 324, 325 and 326 ($V_L$, $V_C$ and $V_R$, respectively). A reference voltage is applied to the metal electrodes 324 and 325, and an alternating current voltage with an amplitude of $V_{PPR}/2$ is applied to the metal electrode 326. An alternating current voltage with an amplitude of $V_{PPR}/2$ is applied across the metal electrodes 325 and 326. Therefore, as shown in FIG. 23, second silicon nanowires 335 are aligned in portions where the metal electrodes 325 and 326 face each other. Meanwhile, no voltage is applied across the metal electrodes 324 and 325. Therefore, no second silicon nanowires are aligned in portions where the metal electrodes 324 and 325 face each other. The above description is the second microscopic structure aligning step.

In the above-described procedure, two types of microscopic structures can be selectively aligned in desired locations. The first type of microscopic structures may be NMOS nanowires, and the second type of microscopic structures may be PMOS nanowires, for example. As a result, a CMOS structure can be formed.

Incidentally, as shown in FIG. 24, first silicon nanowires 336 may be adsorbed in unpreferred locations in the first microscopic structure aligning step. Here, unpreferred locations means portions on the metal electrode 326, in particular, portions where the metal electrodes 325 and 326 face each other. These portions are locations where second silicon nanowires 335 are aligned, and in the case where some first silicon nanowires 334 remain there, defects may be caused when the silicon nanowires are used as devices.

FIG. 25 shows an example of preferable potentials to be applied across the metal electrodes 324, 325 and 326 in the first microscopic structure aligning step ($V_L$, $V_C$ and $V_R$, respectively) in order to remove the first silicon nanowires 336 adopted in unpreferred locations. This is different from the above-described first microscopic structure aligning step (FIG. 20) in that an operation for applying an offset voltage ($V_{DCR}$) to the metal electrode 326 is carried out. At the moment when the offset voltage is applied, it can be observed that the first silicon nanowires 336 adsorbed in unpreferred locations move away from the electrodes with great force. When this operation is carried out, microscopic structures, which are not preferable can be prevented from being mixed in when two types of microscopic structures are selectively aligned in desired locations.

0.1 to 5 V is a preferable range for the offset voltage ($V_{DCR}$), and furthermore, it is preferable for the offset voltage to be 0.3 to 2 V.

Third Embodiment

The third embodiment of the present invention is an example of a device and an integrated circuit using the microscopic structures aligned in the first and second embodiments. A case as that above, where microscopic structures having the configuration in FIG. 1B are applied as devices, is described in the present embodiment.

Figure 26:
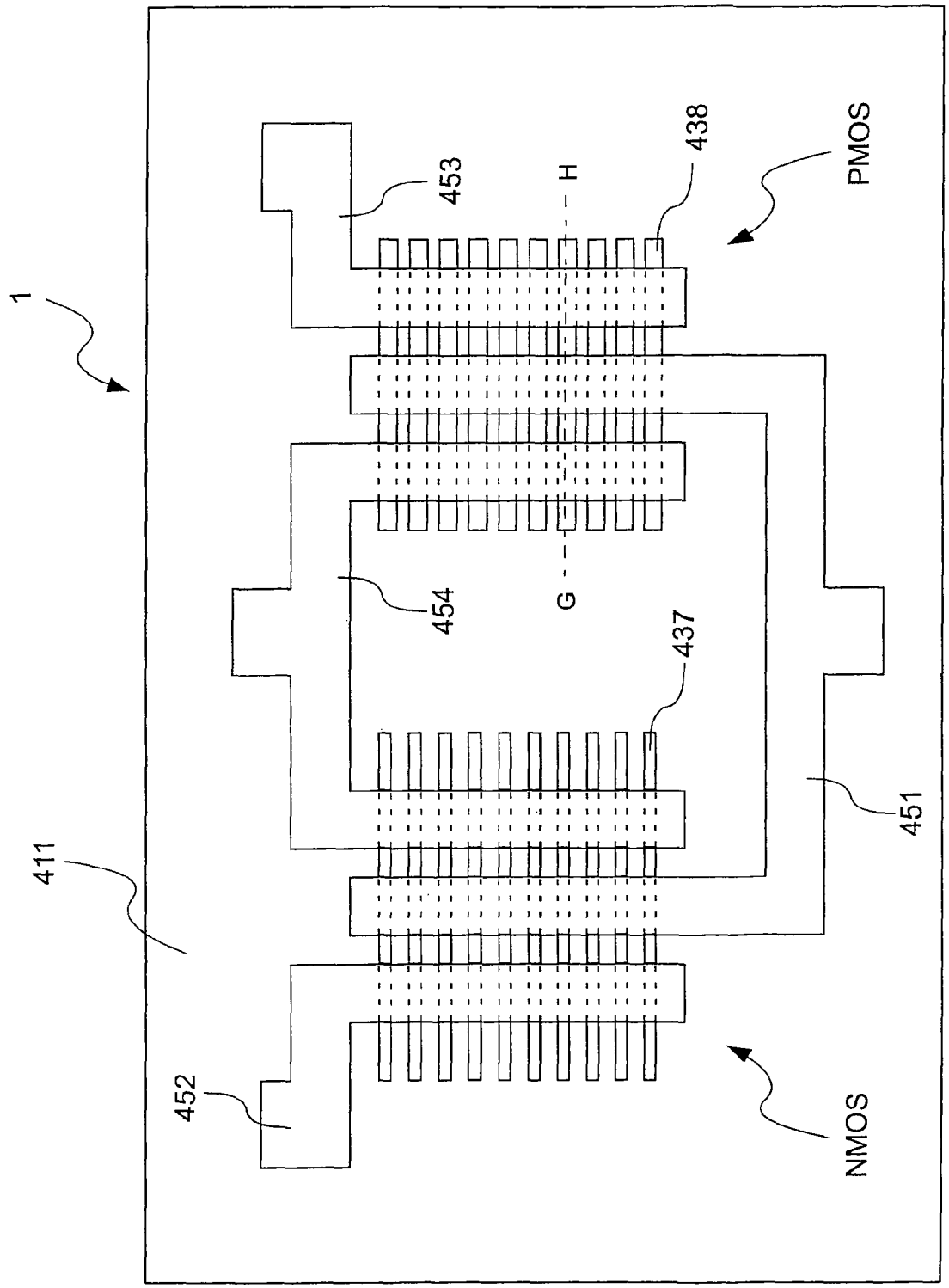
FIG. 26 is a plan diagram showing wires on a substrate for forming an integrated circuit apparatus 1, which is a portion of the integrated circuit apparatus according to a third embodiment of the present invention.
Figure 27:
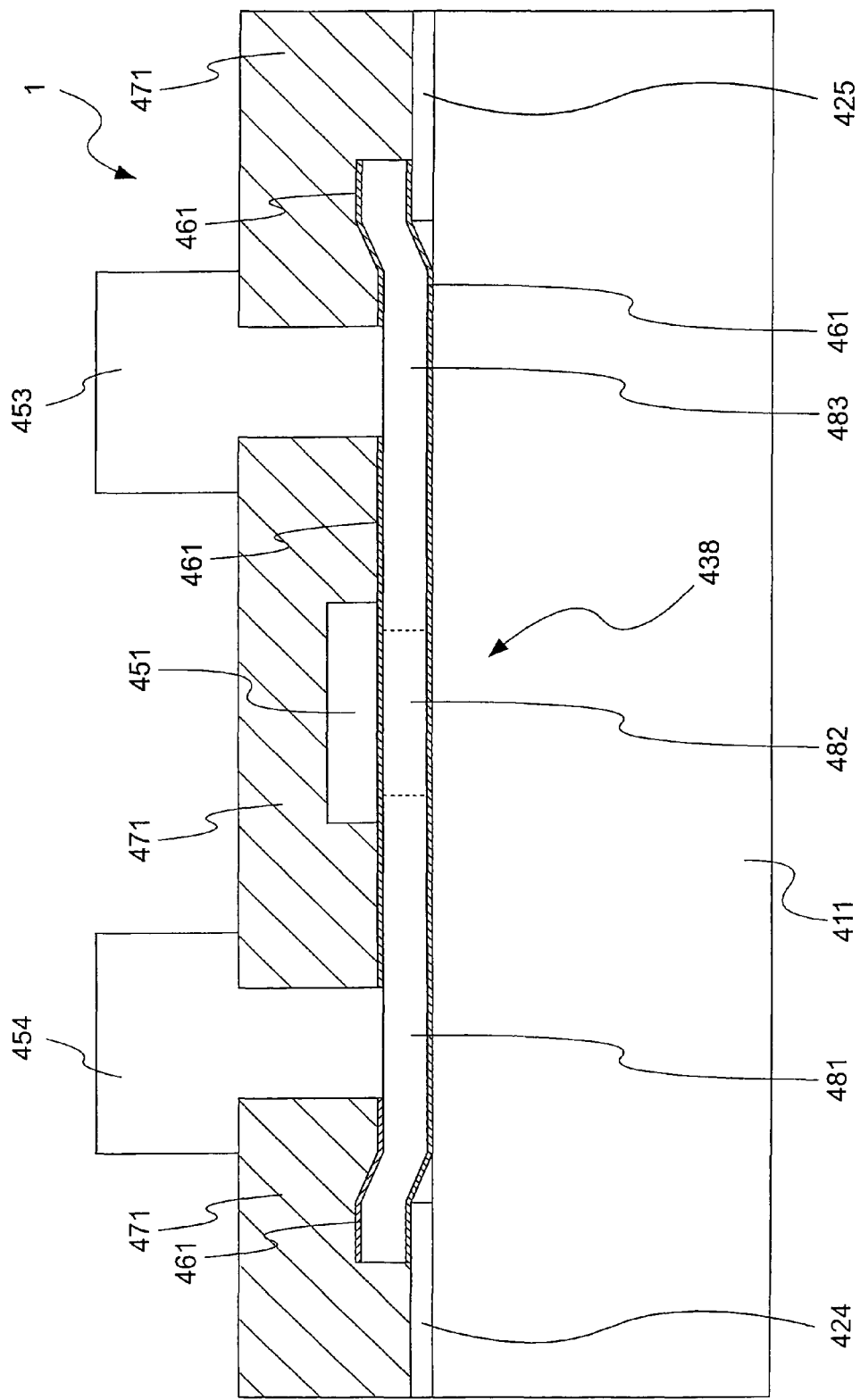
FIG. 27 is a cross sectional diagram along a line G-H in FIG. 26.

The present embodiment is described in reference to FIGS. 26 and 27. A case where two nanowire elements (N channel type and P channel type) are placed on the same substrate is described in the present embodiment as a concrete example of an integrated circuit apparatus. The integrated circuit apparatus according to the present invention may, of course, have a configuration where three or more elements having different functions are provided on the same substrate.

FIG. 26 is a plan diagram showing wires on a substrate where an integrated circuit apparatus 1 is formed as a portion of the integrated circuit apparatus according to the present invention. Here, for the sake of simplicity in the description, the integrated circuit apparatus 1 according to the present embodiment is provided with an interlayer insulating film 471, not shown in FIG. 26 (shown in FIG. 27). The configuration of the interlayer insulating film 471 is described in reference to FIG. 27.

In reference to FIG. 26, an N type field effect transistor (hereinafter referred to as "NMOS: n type metal oxide semiconductor field effect transistor") and a P type field effect transistor (hereinafter referred to as "PMOS: p type metal oxide semiconductor field effect transistor") are placed on the substrate 411 of the integrated circuit apparatus 1 as two nanowire elements having different functions. In addition, elements placed on the substrate 411 of the integrated circuit apparatus 1 may be elements of different materials.

The NMOS is formed by aligning a plurality of nanowires 437, and the PMOS is formed by aligning a plurality of nanowires 438.

The nanowires 437 which form the NMOS and the nanowires 438 which form the PMOS have two common wires, that is, a metal wire 451 and a metal wire 454. In addition, the nanowire 437 is connected to a metal wire 452 and the nanowire 438 is connected to a metal wire 453.

In the integrated circuit shown in FIG. 26, the metal wire 451 is connected to an input terminal and the metal wire 454 is connected to an output terminal. In addition, the metal wire 452 is connected to a ground terminal and the metal wire 453 is connected to a power supply terminal.

It is preferable for the surface of the substrate 411 to have insulating properties, and an insulator, a semiconductor where an insulating film is formed on the surface, and a conductor where an insulating film is formed on the surface, for example, can be used as an appropriate substrate in the present embodiment. In addition, in the case where an integrated circuit apparatus is incorporated in a liquid crystal panel of a display apparatus, it is preferable for the substrate 411 to have insulating properties and be transparent. A substrate of which the material is glass, a transparent resin or the like can be cited as an example.

The PMOS used in the present embodiment is formed by aligning a plurality of nanowires 438 as described above. In addition, one nanowire 438 functions as the PMOS. The nanowire 438 used in the present embodiment is described in reference to FIG. 27.

FIG. 27 shows a case where an interlayer insulating film 471 is formed in the integrated circuit apparatus 1 shown in FIG. 26, and is a cross sectional diagram along a line G-H in FIG. 26. The nanowires 438 are aligned on the substrate 411, and the nanowires 438 are formed of cores formed of a semiconductor in a wire form and insulating films 461 which cover the cores. In addition, the cores are provided with a region 481 having a P type conductivity, a region 482 having an N type conductivity, and a region 483 having a P type conductivity.

The metal wire 451 is connected to the insulating film 461 in the center portion of the nanowires 438, and the entirety, except for portions where the nanowires 438, the substrate 411, the metal wire 451, the metal wire 452 and the metal wire 454 make contact, is coated with the interlayer insulating film 471.

The above-described region 482 is connected to the metal wire 451 via the insulating film 461 so as to function as a channel region for the nanowires 438 when the metal wire 451 connected to the input terminal functions as a gate electrode. That is, the insulating film 461, which covers the region 482, functions as a gate insulating film.

The core and the metal wire 453 are connected to the region 483 where the insulating film 461 is removed. In addition, the core and the metal wire 454 are connected to the region 481 where the insulating film 461 is removed. The region 483 is connected to the metal wire 453, which is connected to the power supply terminal and works as a source region for the nanowire 438. In addition, the region 481 is connected to the metal wire 454, which is connected to the output terminal and works as a drain region for the nanowires 438.

Here, in the same manner as with the above-described PMOS, the NMOS used in the present embodiment is formed by aligning a plurality of nanowires 437 as described above. In addition, one nanowire 437 functions as an NMOS. The nanowires 437 used in the present embodiment are about the same as the nanowires 438, except that the conductivity type is the opposite, and therefore, the description thereof is omitted.

Here, electrodes 424 and 425 in FIG. 27 are used when the nanowires are aligned. FIG. 26 does not show the electrodes 424 and 425.

As described above, the nanowires 437 and 438 are NMOS and PMOS, respectively, in the present embodiment. In order to use nanowires as an NMOS or a PMOS, nanowires are aligned on a substrate, and after that, impurity ions may be implanted, and annealing for activation may be carried out. Alternatively, nanowires into which impurities are introduced in advance and which have undergone annealing for activation may be aligned on a substrate. In the latter case, the substrate is not exposed to high temperatures for annealing for activation, and therefore, there is an advantage, such that it is easy to use a flexible substrate.

More concretely, in the former case, a metal wire 451 is used as a mask to implant impurity ions for n type conductivity (for example arsenic ions) only in the area where there are nanowires 437 at the stage where the metal wire 451 is formed, in order to convert the nanowires 437 to an NMOS. After that, the metal wire 451 is used as a mask to implant impurity ions for p type conductivity (for example boron ions) in the area where there are nanowires 438, in order to convert the nanowires 438 to a PMOS. After that, annealing for activating the impurities (for example at 500 to 900° C.) may be carried out.

In the latter case, silicon nanowires having an impurity profile of n+/p/n+ (NMOS) and p+/n/p+ (PMOS) are formed in advance. In order to form these silicon nanowires, impurities for n type, impurities for p type and impurities for n type, for example, are introduced into the silicon nanowires in sequence while the silicon nanowires are growing (in the case where nanowires having an n+/p/n+ structure are formed). After that, the respective silicon nanowires may be aligned in predetermined locations on a substrate.

The interlayer insulating film and the upper portion metal wires can be formed by applying a process used in LSI processing and liquid crystal TFT processing.

It is preferable for the number of nanowires for forming one nanowire element in the integrated circuit apparatus according to the present invention to be 10 to 200. In the case where the dispersion in the drive current for one nanowire is 15%, for example, the dispersion in the drive current for a nanowire element made up of ten nanowires becomes about 4.7%. The dispersion in the drive current is lower than 5%, and therefore, sufficient yield can be gained in mass production. That is, in nanowire elements formed of nine or less nanowires, the dispersion in the drive current is great, and sufficient yield cannot be gained in mass production.

In addition, in the case where 200 nanowires having a diameter of 50 nm are aligned with a pitch of 100 nm, the size of the nanowire element (W in FIG. 15) becomes 20 μm. The nanowire elements are formed of nanowires of a microscopic size, and therefore, are appropriate for miniaturized elements. In the case where 200 or more nanowires are aligned, however, the size of the nanowire element exceeds 20 μm, and a problem arises, such that the size of the device becomes too great for it to be used as a transistor for driving a pixel.

The integrated circuit apparatus 1 shown in FIG. 26 is an inverter circuit formed of an NMOS and a PMOS.

The present embodiment shows an inverter circuit (NOT circuit) as a concrete example where an NMOS and a PMOS are combined. However, circuits which can be formed by combining nanowire elements according to the present invention are not limited to this, and an AND circuit, a NAND circuit, a NOR circuit and an XOR circuit can be formed. In addition, a more complex logic circuit can be formed by combining these circuits.

As described above, the integrated circuit apparatus according to the present embodiment is formed in accordance with a method for aligning microscopic structures, which makes alignment with accurate control in desired locations and in a desired direction possible. Accordingly, it becomes possible to greatly increase the yield of integrated circuit apparatuses.

Fourth Embodiment

A fourth embodiment of the present invention is an example where the microscopic structures which are aligned in the above-described examples are applied to a display.

Figure 28:
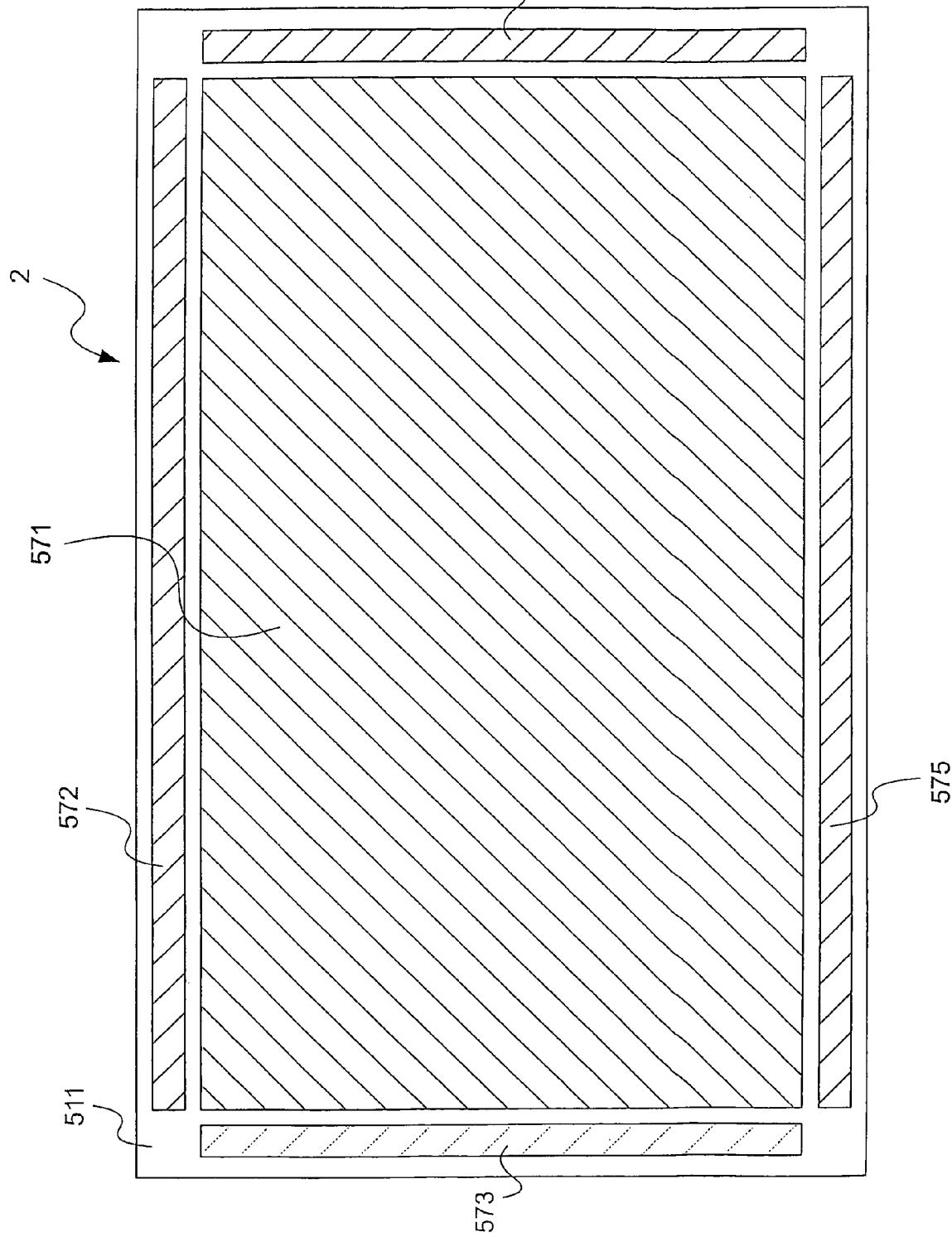
FIG. 28 is a plan diagram showing a display according to a fourth embodiment of the present invention.

A display on which the integrated circuit apparatus according to the present invention is mounted is described in reference to FIG. 28. FIG. 28 is a plan diagram showing a display according to the present embodiment.

The display panel 2 of the display has a configuration where a display portion 571, a logic circuit portion 572, a logic circuit portion 573, a logic circuit portion 574 and a logic circuit portion 575 are provided on the same transparent substrate 511. In the case where the display is a liquid crystal display, nanowire transistors and pixel electrodes, which are required to drive pixels placed in a matrix, are formed in a matrix in the display portion 571.

In addition, in the case where light emitting elements formed of a plurality of nanowires are used instead of pixel electrodes, a display having logic circuits and selfluminous elements can be implemented within the display panel. In the logic circuit portion 572, the logic circuit portion 573, the logic circuit portion 574 and the logic circuit portion 575, logic circuits formed of nanowire transistors carry out image processing and other operations.

Though TFT's are used as conventional transistors for driving pixels and processing images, the following effects can be gained by replacing these with nanowire elements.

First, a CVD (chemical vapor deposition) oxide film using TEOS (tetraethyl orthosillicate) is used for the formation of the gate insulating film of general TFT's. Therefore, TFT's have a low transconductance and great dispersion in the transconductance in comparison with MOS transistors fabricated using a single crystal silicon substrate where a gate insulating film is formed through thermal oxidation.

Meanwhile, silicon single crystal can be used as the core material for MOS transistors using nanowires, and thus, surround gate type transistors with complete depletion can be formed. Therefore, nanowire MOS transistors can be implemented as transistors having a high transconductance and little dispersion in the transconductance in comparison with conventional MOS transistors.

Therefore, displays having the integrated circuit apparatus according to the present invention and the display portion on the same substrate have high performance in comparison with displays using TFT's. Therefore, it is possible to lower the drive voltage for the display and lower the power consumption.

Next, in order for the display to be formed of TFT's, large-scale equipment, including a gigantic vacuum unit and a deposition unit, is required, because the manufacture of the display and the manufacture of TFT's cannot be carried out separately. However, the process for manufacturing nanowires and the process for manufacturing the display are separate in the present embodiment, and therefore, the display can be manufactured with relatively small equipment. As a result, it becomes possible to greatly lower the cost for manufacturing displays.

In addition, the display according to the present embodiment is formed in accordance with a method for aligning microscopic structures according to which microscopic structures can be aligned with accurate control in desired locations and in a desired direction. Accordingly, it becomes possible to greatly increase the yield of displays.

According to the present invention, it becomes possible to align microscopic structures with accurate control in desired locations and in a desired direction. The microscopic structures can be used for switching elements, memory elements, light emitting elements, resistor elements and the like, and therefore, can be widely adopted in integrated circuit apparatuses, displays and the like where devices made up of microscopic structures are integrated.

What is claimed is:

1. A method for aligning microscopic structures, comprising:
   a substrate preparing step of defining one microscopic structure-aligning region having as a unit three electrodes to which independent potentials are applied and preparing an insulating substrate having one or more of the microscopic structure-aligning regions formed;
   a microscopic structure applying step of applying a liquid including microscopic structures ranging from a nano scale to a micron scale on said insulating substrate; and
   a microscopic structure aligning step of applying respective voltages to said three electrodes to align said microscopic structures in the microscopic structure-aligning regions defined by the electrodes.

2. The method for aligning microscopic structures according to claim 1, wherein said microscopic structures are aligned mainly in a direction perpendicular to a direction in which said electrodes are formed.

3. The method for aligning microscopic structures according to claim 1, wherein said microscopic structures are aligned in locations separated by a distance beyond a repulsive force generated by a charge induced in the microscopic structures.

4. The method for aligning microscopic structures according to claim 1, wherein
   a first electrode and a second electrode among said three electrodes define said microscopic structure-aligning region,
   a third electrode is placed between said first and second electrodes in said microscopic structure-aligning region, and
   a reference potential is applied to said third electrode and alternating current potentials are applied to said first and second electrodes during said microscopic structure aligning step.

5. The method for aligning microscopic structures according to claim 4, wherein
the alternating current potentials applied to said first and second electrodes have the same frequency and a phase difference of 150 to 210°.

6. The method for aligning microscopic structures according to claim 4, wherein an average of the potentials applied to said first and second electrodes is different from the reference potential applied to the third electrode.

7. The method for aligning microscopic structures according to claim 4, wherein
an offset voltage applying operation for applying an offset voltage for the third electrode to said first and second electrodes is carried out during said microscopic structure aligning step.

8. The method for aligning microscopic structures according to claim 7, wherein a time difference in applying the offset voltage to said first and second electrodes is 0.1 second or less in said offset voltage applying operation.

9. The method for aligning microscopic structures according to claim 7, wherein the offset voltages applied to said first and second electrodes are equal in said offset voltage applying operation.

10. The method for aligning microscopic structures according to claim 7, wherein said offset voltage applying operation is repeated.

11. The method for aligning microscopic structures according to claim 10, wherein said offset voltage applying operation is carried out at intervals of 1 to 10 seconds.

12. A method for aligning microscopic structures, comprising:
a substrate preparing step of defining one microscopic structure-aligning region having as an unit three electrodes including fourth, fifth and sixth electrodes to which independent potentials are applied and preparing an insulating substrate having one or more of the microscopic structure-aligning regions formed;
a microscopic structure applying step of applying a liquid including microscopic structures ranging from a nano scale to a micron scale on the insulating substrate; and
a microscopic structure aligning step of applying voltages to said three electrodes to align the microscopic structures in the microscopic structure-aligning regions defined by the electrodes, wherein
the microscopic structure aligning step includes a first microscopic structure aligning step of aligning first microscopic structures across the fourth and fifth electrodes, and a second microscopic structure aligning step of aligning second microscopic structures across the fifth and sixth electrodes,
in the first microscopic structure aligning step, a reference potential is applied to said fifth and sixth electrodes and a potential that is different from the reference potential is applied to the fourth electrode, and
in the second microscopic structure aligning step, a reference potential is applied to said fourth and fifth electrodes and a potential that is different from the reference potential is applied to the sixth electrode.

13. The method for aligning microscopic structures according to claim 12, wherein an offset voltage for the fourth and fifth electrodes is applied to the sixth electrode during said first microscopic structure aligning step.

14. The method for aligning microscopic structures according to claim 12, wherein said microscopic structures are aligned mainly in a direction perpendicular to a direction in which said electrodes are formed.

15. The method for aligning microscopic structures according to claim 12, wherein said microscopic structures are aligned in locations separated by a distance beyond a repulsive force generated by a charge induced in the microscopic structures.

* * * * *